(12) United States Patent
Nojiri

(10) Patent No.: US 7,348,801 B2
(45) Date of Patent: Mar. 25, 2008

(54) LEVEL SHIFTER

(75) Inventor: Naoki Nojiri, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 72 days.

(21) Appl. No.: 11/376,185

(22) Filed: Mar. 16, 2006

(65) Prior Publication Data

US 2006/0208759 A1   Sep. 21, 2006

(30) Foreign Application Priority Data

Mar. 16, 2005   (JP)   ............................... 2005-075640

(51) Int. Cl.
*H03K 19/0175*   (2006.01)
(52) U.S. Cl. .............................. 326/81; 326/68; 326/80
(58) Field of Classification Search ................... 326/68, 326/80–81; 327/333
See application file for complete search history.

(56) References Cited

U.S. PATENT DOCUMENTS

| | | | |
|---|---|---|---|
| 6,417,716 B1 * | 7/2002 | Riccio | ......................... 327/333 |
| 6,445,210 B2 | 9/2002 | Nojiri | |
| 6,483,345 B1 | 11/2002 | Whittaker et al. | |
| 2002/0011873 A1 * | 1/2002 | Riccio et al. | .................. 326/80 |
| 2005/0134355 A1 | 6/2005 | Maede et al. | |

FOREIGN PATENT DOCUMENTS

| | | |
|---|---|---|
| JP | 2001-298356 | 10/2001 |
| JP | 2002-076881 | 3/2002 |
| JP | 2002-076882 | 3/2002 |

* cited by examiner

*Primary Examiner*—Anh Q. Tran
(74) *Attorney, Agent, or Firm*—McDermott Will & Emery LLP

(57) ABSTRACT

In a level shifter, OFF leakage currents flow through two N-type transistors for signal input even when they are OFF. However, another N-type transistor serving as an OFF leakage generation circuit and three P-type transistors serving as current mirrors, which constitute a current conversion circuit, supply to the signal-input transistors a current equivalent to or greater than the OFF leakage currents flowing through the signal-input transistors when they are OFF, thereby canceling the OFF leakage currents. Therefore, one of nodes which is at H level is surely fixed to a potential equal to a higher voltage supply. Thus, the level shifter surely operates with a high speed even when large OFF leakage currents flow through the signal-input transistors.

5 Claims, 28 Drawing Sheets

LEVEL SHIFTER

CROSS-REFERENCE TO RELATED APPLICATION

This Non-provisional application claims priority under 35 U.S.C. §119(a) on patent application Ser. No. 2005-075640 filed in Japan on Mar. 16, 2005, the entire contents of which are hereby incorporated by reference.

BACKGROUND OF THE INVENTION

The present invention relates to a level shifter for converting the logic level and specifically to a level shifter which has a structure for achieving a low-voltage operation.

FIG. 25 is a circuit diagram showing a conventional level shifter.

The level shifter of FIG. 5 includes two N-type transistors N51 and N52, two P-type transistors P51 and P52 of cross-couple type wherein the gate of each transistor is connected to the drain of the other, and a first inverter INV50. The first inverter INV50 inverts an input signal from an input terminal IN and operates with lower voltage supply VDD of, e.g., 1.5 V. The elements other than the first inverter INV50 are higher voltage side elements which operate with higher voltage supply VDD3 of, e.g., 3.3 V. The two N-type transistors N51 and N52 have grounded sources and receive signals complementary to each other, i.e., the signal from the input terminal IN and the inverse of the input signal from the first inverter INV50. The two P-type transistors P51 and P52 have sources connected to higher voltage supply VDD3, gates cross-coupled to drains of each other, and drains connected to the drains of the N-type transistors N51 and N52, respectively. The connection point of the P-type transistor P51 and the N-type transistor N51 is a node W51, and the connection point of the P-type transistor P52 and the N-type transistor N52 is a node W52. The node W52 is connected to an output terminal OUT.

Next, an operation of the above level shifter is described. In a stationary state, for example, if the input signal is at H (VDD) level and the inverse thereof is at L (VSS=0 V) level, the N-type transistor N51 is ON, the N-type transistor N52 is OFF, the P-type transistor P51 is OFF, and the P-type transistor P52 is ON. The node W51 is at L (VSS) level, and the node W52 is at H (VDD3) level. Since the N-type transistor N51 and the P-type transistor P51 are complementary to each other and the N-type transistor N52 and the P-type transistor P52 are also complementary to each other, no current flows during this stationary state.

Thereafter, the input signal transitions to L (VSS) level. At the time of the state transition, the N-type transistor N51 is turned OFF, and the N-type transistor N52 is turned ON. Therefore, a through current flows from higher voltage supply VDD3 to the ground via the P-type transistor P52 and the N-type transistor N52 which are ON, so that the potential of the node W52 starts decreasing from H (VDD3) level. When the potential of the node W52 falls on or below VDD3-Vtp (Vtp is the threshold voltage of the P-type transistor P52), the P-type transistor P51 starts being turned ON, and the potential of the node W51 (the potential at the gate of the P-type transistor P52) increases, so that the drain current of the P-type transistor P52 decreases, and the potential of the node W52 further decreases.

Finally, the potential of the node W51 is at H (VDD3) level, and the potential of the node W52 at L (VSS) level, so that no through current flows and the output logic is inverted. Then, the operation waits for a next change in the input signal. Although the example where the input signal transitions from H (VDD) level to L (VSS) level has been described herein, the same applies to the inverse case.

In the above structure, when lower voltage supply VDD is as low as near the threshold voltage of the N-type transistors N51 and N52, the drain currents of the N-type transistors N51 and N52, which are necessary for decreasing the potentials of the nodes W51 and W52, are decreased. If the decreased drain currents are far smaller than the drain currents of the P-type transistors P51 and P52 which occur when they are ON, the potentials of the cross-coupled gates of the P-type transistors P51 and P52 cannot be decreased, so that the level shifter would not operate in some cases.

In view of such, conventionally, in the N-type transistors N51 and N52, the gate width is increased or the threshold voltage is lowered in order to increase the drain current during a period when they are ON, while in the P-type transistors P51 and P52 the gate width is decreased or the gate length is increased in order to decrease the drain current (i.e., in order to increase the ON resistance value) during a period when they are ON.

However, in the above-described conventional level shifter, if the ON resistance value of the P-type transistors P51 and P52 is increased to achieve a low-voltage operation, the drain currents of the P-type transistors P51 and P52 become small at the time of increasing the potentials of the nodes W51 and W52, and as a result, a high-speed operation cannot be achieved.

Conventionally, to overcome such a problem, Japanese Laid-Open Patent Publication No. 2002-76881 has proposed a level shifter wherein each of the nodes W51 and W52 is divided into a node whose potential is quickly decreased and a node whose potential is quickly increased. This level shifter is shown in FIG. 26. The level shifter of FIG. 26 includes, in addition to the components of FIG. 25, a resistor R51 between the node W51 and the gate of the P-type transistor P52 and a resistor R52 between the node W52 and the gate of the P-type transistor P51. The level shifter further includes a node W53 at the connection point of the resistor R51 and the gate of the P-type transistor P52, an N-type transistor N53 between the node W53 and the ground, a node W54 at the connection point of the resistor R52 and the gate of the P-type transistor P51, and an N-type transistor N54 between the node W54 and the ground. The gates of the N-type transistors N51 and N53 are connected to the input terminal IN. The gates of the N-type transistors N52 and N54 are connected to the output of the inverter INV50.

In the level shifter of FIG. 26, for example, when the input signal is at H (VDD) level, the N-type transistors N51 and N53 are ON, the N-type transistors N52 and N54 are OFF, the nodes W51 and W53 are at L (VSS) level, the P-type transistor P52 is ON, the nodes W52 and W54 are at H (VDD3) level, and the P-type transistor P51 is OFF. At the time of a state transition from this state to the state where the input signal falls from H (VDD) level to L (VSS) level, the N-type transistors N51 and N53 are turned OFF so that the nodes W51 and W53 are disconnected from the ground, while the N-type transistors N52 and N54 are turned ON so that the nodes W52 and W54 are connected to the ground and the potentials thereof start decreasing. On this occasion, if the resistor R52 has been set to have a large resistance value and the P-type transistor P52 has been set to have a small ON resistance value during a period when it is ON, the node W54 is connected with higher voltage supply VDD3 via the resistor R52 having high resistance value, and the potential of the node W54 falls to L (VSS) level more quickly than the potential of the node W52. Further, the P-type transistor P51 is turned ON so that the potential of the node W51 increases more quickly. Furthermore, the gate of the P-type transistor P52 transitions to H (VDD3) level through the resistor R51 so that the P-type transistor P52 is turned OFF, whereby the potential of the node W52 is decreased to L (VSS) level. Although the example where the input signal transitions from H (VDD) level to L (VSS) level has been described herein, the same applies to the inverse case.

To enable the level shifter to operate at a lower voltage, it is effective, for the same reasons as those previously described for the level shifter of FIG. 25, that the resistors R51 and R52 are set to have a large resistance value and that the N-type transistors N53 and N54 are set to have a large gate width or a low threshold voltage such that the drain currents become large during a period when they are ON.

Conventionally, Japanese Laid-Open Patent Publication No. 2001-298356 has proposed a level shifter wherein a current is interrupted according to the potentials of the nodes W51 and W52. The structure of this level shifter is shown in FIG. 27.

The level shifter of FIG. 27 includes, in addition to the components of FIG. 25, P-type transistors P53 and P54 for current interruption between higher voltage supply VDD3 and the P-type transistors P51 and P52, respectively. The level shifter further includes a delay circuit D51 through which the potential of the node W51 is applied to the gate of the P-type transistor P53 and a delay circuit D52 through which the potential of the node W52 is applied to the gate of the P-type transistor P54. The connection point of the P-type transistors P51 and P53 is a node W55. The connection point of the P-type transistors P52 and P54 is a node W56. The level shifter further includes a pull-up resistor R53 between the nodes W55 and W56 for preventing the nodes W51 and W52 from floating.

In the above-described conventional level shifter having the current interruption function, for example, when the input signal is at H level, the N-type transistor N51 is ON, the N-type transistor N52 is OFF, the node W51 is at L (VSS) level, the node W52 is at H (VDD3) level, the P-type transistors P51 and P54 are OFF, and the P-type transistors P52 and P53 are ON. In this case, the node W52 is pulled up to higher voltage supply VDD3 by the P-type transistor P52, the resistor R53 having a large resistance value, and the P-type transistor P53. At the time of a state transition from this state to the state where the input signal falls to L (VSS) level, the N-type transistor N51 is turned OFF so that the node W51 is disconnected from the ground, while the N-type transistor N52 is turned ON so that the node W52 is connected to the ground and the potential thereof decreases. This change in potential is transferred to the P-type transistor P54, but the transfer is delayed by the delay circuit D52 by a predetermined time. During the predetermined delay time, the P-type transistor P51 is turned ON due to the decrease in potential at the node W52 so that higher voltage supply VDD3 and the node W51 are connected through the P-type transistors P51 and P53. Accordingly, the potential of the node W51 increases so that the P-type transistor P52 is turned OFF. Then, after the predetermined delay time generated by the delay circuit D52 due to the decrease in potential at the node W52, the P-type transistor P54 is turned ON. The increase in potential at the node W51 causes the P-type transistor P53 to be turned OFF after the predetermined delay time generated by the delay circuit D51. As a result, the node W51 is pulled up to higher voltage supply VDD3 by the P-type transistor P51, the resistor R53, and the P-type transistor P54, thereby being prevented from floating.

Although the example where the input signal transitions from H (VDD) level to L (VSS) level has been described herein, the same applies to the inverse case.

To enable the level shifter to operate at a lower voltage, it is effective, for the same reasons as those previously described for the level shifter of FIG. 25, that the resistor R53 is set to have a large resistance value and that the N-type transistors N51 and N52 are set to have a large gate width or a low threshold voltage such that the drain current becomes large during a period when they are ON.

Japanese Laid-Open Patent Publication No. 2002-76882 has proposed a level shifter wherein changes in potential at the nodes W51 and W52 are detected for precharge control. The structure of this level shifter is shown in FIG. 28.

The level shifter of FIG. 28 includes, in addition to the components of FIG. 25, N-type transistors N55 and N56 between the ground and the N-type transistors N51 and N52, respectively. Instead of cross-coupling the gates of the P-type transistors P51 and P52, the gate of the N-type transistor N55 is connected to the gate of the P-type transistor P51, and the gate of the N-type transistor N56 is connected to the gate of the P-type transistor P52, whereby the nodes W51 and W52 are precharged, respectively. The level shifter further includes NAND circuits Nand51 and Nand52 and inverters INV51 and INV52. The NAND circuit Nand51 receives output signals of the node W51 and the NAND circuit Nand52. The NAND circuit Nand52 receives output signals of the node W52 and the NAND circuit Nand51. The inverter INV51 receives the output signal of the NAND circuit Nand51 and has an output terminal connected to the gate of the P-type transistor P51 and the gate of the N-type transistor N55. The inverter INV52 receives the output signal of the NAND circuit Nand52 and has an output terminal connected to the gate of the P-type transistor P52 and the gate of the N-type transistor N56. With this structure, detection of decreases in potential at the nodes W51 and W52 and a precharge operation are controlled. The level shifter further includes a pull-up resistor R54 between the nodes W51 and W52 for preventing the nodes W51 and W52 from floating. The output terminal OUT is connected to the output of the NAND circuit Nand52 instead of the node W52.

In the above-described conventional level shifter having the precharge control function, for example, when the input signal is at H (VDD) level, the nodes W51 and W52 are both at H (VDD3) level, the output of the NAND circuit Nand51 is at H (VDD3) level, the output of the NAND circuit Nand52 is at L (VSS) level, and a flip flop circuit formed by the NAND circuits Nand51 and Nand52 holds the output logic. In this case, the output of the inverter INV51 is at L (VSS) level, and the output of the inverter INV52 is at H (VDD3) level. Therefore, the P-type transistor P51 is ON so that the node W51 is connected to higher voltage supply VDD3, while the N-type transistor N55 is OFF so that the node W51 is disconnected from the ground, whereby the node W51 is precharged to a potential equal to higher voltage supply VDD3. Meanwhile, the P-type transistor P52 is OFF so that the node W52 is disconnected from the ground, while the N-type transistor N56 is ON so that the N-type transistor N52 is connected to the ground, whereby the node W52 is pulled up to higher voltage supply VDD3 by the resistor R54 having a large resistance value and the P-type transistor P51.

At the time of a state transition from this state to the state where the input signal falls to L (VSS) level, the N-type transistor N51 is turned OFF while the N-type transistor N52 is turned ON so that the node W52 is connected to the ground and the potential thereof decreases. When the potential of the node W52 falls below the switching level of the NAND circuit Nand52, the output of the NAND circuit Nand52 is inverted to H (VDD3) level, and the output of the NAND circuit Nand51 is inverted to L (VSS) level, so that the output logic at the output terminal OUT is inverted. The output logic of the inverter INV51 is inverted to H (VDD3) level, and the output logic of the inverter INV52 is inverted to L (VSS) level, so that the N-type transistor N56 is turned OFF, whereby the node W52 is disconnected from the ground. Meanwhile, the P-type transistor P52 is turned ON so that the node W52 is connected to higher voltage supply VDD3, whereby the node W52 is precharged to a potential equal to higher voltage supply VDD3. As for the precharged node W51, the P-type transistor P51 is turned OFF while the N-type transistor N55 is turned ON so that the N-type transistor N51 is connected to the ground, whereby the node W51 is pulled up to higher voltage supply VDD3 by the resistor R54 and the P-type transistor P52. Then, the operation waits for a next change in the input signal. Although the example where the input signal transitions from H (VDD) level to L (VSS) level has been described herein, the same applies to the inverse case.

To enable the level shifter to operate at a lower voltage, it is effective, for the same reasons as those previously described for the level shifter of FIG. 25, that the resistor R54 is set to have a large resistance value and that the N-type transistors N51 and N52 are set to have a large gate width or a low threshold voltage such that the drain currents become large during a period when they are ON.

However, in the level shifter of FIG. 25, if the P-type transistors P51 and P52 are set to have a large ON resistance value such that the level shifter operates even when lower voltage supply VDD is further lowered, the connection resistance of the node W51 or W52 which is currently connected to higher voltage supply VDD3 becomes large during a stationary state where the potential of the node W51 or W52 is at H (VDD3) level. Thus, even if the corresponding N-type transistor N51 or N52 for signal input is OFF, the potential of the node W51 or W52 is lower than a potential equal to higher voltage supply VDD3 due to an OFF leakage current flowing therethrough. If, alternatively, the N-type transistors N51 and N52 for signal input are set to have a lower threshold voltage such that the level shifter operates even when lower voltage supply VDD is further lowered, the OFF leakage current increases accordingly during a period when the N-type transistor N51 or N52 is OFF, and the decrease in potential from higher voltage supply VDD3, which occurs when the node W51 or W52 is at H (VDD3) level, becomes greater. If this potential decrease level becomes greater than the threshold voltage of the P-type transistor P51 or P52, the P-type transistor P51 or P52 cannot be turned OFF, so that the level shifter can cause a malfunction. Furthermore, in the N-type transistors N51 and N52 for signal input, the OFF leakage current increases even when the threshold voltage is decreased due to a variation in temperature or production process thereof, thereby inhibiting the normal operation.

In the level shifter of FIG. 26, if the resistors R51 and R52 are set to have a large resistance value such that the level shifter operates even when lower voltage supply VDD is further lowered, the connection resistance of the node W53 or W54 which is currently connected to higher voltage supply VDD3 becomes large during a stationary state where the potential of the node W53 or W54 is at H (VDD3) level. Thus, even if the corresponding N-type transistor N53 or N54 for signal input is OFF, the, potential of the node W53 or W54 is lower than a potential equal to higher voltage supply VDD3 due to an OFF leakage current flowing therethrough. If, alternatively, the N-type transistor N53 and N54 for signal input are set to have a lower threshold voltage such that the level shifter operates even when lower voltage supply VDD is further lowered, the OFF leakage current increases accordingly during a period when the N-type transistor N53 or N54 is OFF, and the decrease in potential from higher voltage supply VDD3, which occurs when the node W53 or W54 is at H (VDD3) level, becomes greater. If this potential decrease level becomes greater than the threshold voltage of the P-type transistor P51 or P52, the P-type transistor P51 or P52 cannot be turned OFF, so that the level shifter can cause a malfunction. Furthermore, in the N-type transistors N53 and N54 for signal input, the OFF leakage current increases even when the threshold voltage is decreased due to a variation in temperature or production process thereof, thereby inhibiting the normal operation.

In the level shifter of FIG. 27, if the resistor R53 is set to have a large resistance value such that the level shifter operates even when lower voltage supply VDD is further lowered, the connection resistance of the node W51 or W52 which is currently connected to higher voltage supply VDD3 becomes large during a stationary state where the potential of the node W51 or W52 are at H (VDD3) level. Thus, even if the corresponding N-type transistor N51 or N52 for signal input is OFF, the potential of the node W51 or W52 is lower than a potential equal to higher voltage supply VDD3 due to an OFF leakage current flowing therethrough. If, alternatively, the N-type transistor N51 and N52 for signal input are set to have a lower threshold voltage such that the level shifter operates even when lower voltage supply VDD is further lowered, the OFF leakage current increases accordingly during a period when the N-type transistor N51 or N52 is OFF, and the decrease in potential from higher voltage supply VDD3, which occurs when the node W51 or W52 is at H (VDD3) level, becomes greater. If this potential decrease level becomes greater than the threshold voltage of the P-type transistor P51 or P52, the P-type transistor P51 or P52 cannot be turned OFF, so that the level shifter can cause a malfunction. Furthermore, in the N-type transistors N51 and N52 for signal input, the OFF leakage current increases even when the threshold voltage is decreased due to a variation in temperature or production process thereof, thereby inhibiting the normal operation.

In the level shifter of FIG. 28, if the resistor R54 is set to have a large resistance value such that the level shifter operates even when lower voltage supply VDD is further lowered, the connection resistance of the node W51 or W52 which is currently pulled up to higher voltage supply VDD3 by the resistor R54 becomes large during a stationary state where the node W51 or W52 is pulled up to H (VDD3) level. Thus, even if the corresponding N-type transistor N51 or N52 for signal input is OFF, the potential of the node W51 or W52 is lower than a potential equal to higher voltage supply VDD3 due to an OFF leakage current flowing therethrough. If, alternatively, the N-type transistors N51 and N52 for signal input are set to have a lower threshold voltage such that the level shifter operates even when lower voltage supply VDD is further lowered, the OFF leakage current increases accordingly during a period when the N-type transistor N51 or N52 is OFF, and the decrease in potential from higher voltage supply VDD3, which occurs when the node W51 or W52 is at H (VDD3) level, becomes greater. If this potential falls below the threshold voltage of the NAND circuits Nand51 and Nand52, the level shifter can cause a malfunction. Furthermore, in the N-type transistors N51 and N52 for signal input, the OFF leakage current increases even when the threshold voltage is decreased due to a variation in temperature or production process thereof, thereby inhibiting the normal operation.

SUMMARY OF THE INVENTION

An objective of the present invention is to provide a level shifter wherein: the connection impedance between the drains of N-type transistors for signal input and higher voltage supply VDD3 is set high such that the level shifter is operable even when lower voltage supply VDD is a further lowered voltage; a malfunction due to the OFF leakage currents which flow through the signal-input N-type transistors when they are OFF is prevented even if the signal-input N-type transistors are set to have low threshold voltages; and the level shifter surely operates with a high speed even if the threshold voltages of the signal-input N-type transistors are decreased due to a variation in temperature or production process so that the OFF leakage currents are increased.

To achieve the above objective, according to the present invention, in a level shifter, even if OFF leakage currents flow through two transistors for complementary signal input when they are OFF, currents equivalent to or greater than the OFF leakage currents are supplied to the two transistors, whereby the OFF leakage currents are canceled.

Specifically, a level shifter of the present invention comprises: first and second first-conductivity type transistors for signal input, the first and second first-conductivity type transistors respectively receiving at gates complementary first and second input signals generated using a first voltage supply as a power supply and having ends connected to a ground and the other ends connected to first and second nodes, respectively; a power supply circuit having an end connected to a second voltage supply and the other end connected to the first and second nodes, the power supply circuit supplying a voltage of the second voltage supply to one of the first and second nodes while interrupting the supply of the voltage of the second voltage supply to the other node; an OFF leakage generation circuit formed by a third first-conductivity type transistor which has an end and gate connected to the ground and the other end connected to the third node; and a current conversion circuit connected to the third node to convert a current flowing through the third first-conductivity type transistor to a current flowing from the second voltage supply and amplify the converted current by a predetermined factor, the amplified current being output to the first and second nodes.

In one embodiment of the level shifter of the present invention, the current conversion circuit is a current mirror formed by a second-conductivity type transistor.

In one embodiment of the level shifter of the present invention, the level shifter further comprises a switch circuit between the output of the current conversion circuit and the first and second nodes, the switch circuit being controlled based on the potentials of the first and second nodes to supply the output current of the current conversion circuit to any one of the first and second nodes.

In one embodiment of the level shifter of the present invention, when one of the first and second nodes is equal in potential to the second voltage supply, the switch circuit disconnects the output of the current conversion circuit from the other node; and when the one of the first and second nodes is equal in potential to the ground, the switch circuit connects the output of the current conversion circuit to the other node.

In one embodiment of the level shifter of the present invention, the output of the current conversion circuit is provided between the second voltage supply and the power supply circuit; and the switch circuit is realized by the power supply circuit.

In one embodiment of the level shifter of the present invention, the power supply circuit includes cross-coupled first and second second-conductivity type transistors having ends connected to the second voltage supply and the other ends connected to the first and second nodes, respectively; the level shifter includes a current interrupter for interrupting a through current by disconnecting the second voltage supply from the first or second second-conductivity type transistor when the levels of the input signals change; and the output of the current conversion circuit is output to a connection point of the power interrupter and the first and second second-conductivity type transistors.

A level shifter of the present invention comprises: first and second first-conductivity type transistors for signal input, the first and second first-conductivity type transistors respectively receiving at gates complementary first and second input signals generated using a first voltage supply as a power supply and having ends connected to a ground and the other ends connected to first and second nodes, respectively; cross-coupled first and second second-conductivity type transistors having ends connected to a second voltage supply and the other ends connected to the first and second nodes, respectively; a third second-conductivity type transistor provided between the first node and the gate of the second second-conductivity type transistor; a fourth second-conductivity type transistor provided between the second node and the gate of the first second-conductivity type transistor; third and fourth first-conductivity type transistors for signal input, receiving the first and second input signals, respectively, at gates and having ends connected to the ground and the other ends connected to gates of the second and first second-conductivity type transistors, respectively; an OFF leakage generation circuit formed by a fifth first-conductivity type transistor which has an end and gate connected to the ground and the other end connected to a third node; and a fifth second-conductivity type transistor having an end connected to the second voltage supply and the other end and gate connected to the third node, wherein the gates of the third and fourth second-conductivity type transistors are connected to the third node.

In one embodiment of the level shifter of the present invention, the level shifter further comprises: a sixth second-conductivity type transistor connected between the first node and the gate of the second second-conductivity type transistor; and a seventh second-conductivity type transistor connected between the second node and the gate of the first second-conductivity type transistor, wherein when the potential of one of the first and second nodes changes from the ground potential to the potential of the second voltage supply, the sixth and seventh second-conductivity type transistors connect the one of the first and second nodes with the gate of the first or second second-conductivity type transistor to which the one of the first and second nodes is connected.

In one embodiment of the level shifter of the present invention, the gates of the sixth and seventh second-conductivity type transistors are connected to the first and second nodes, respectively, through a delay circuit.

A level shifter of the present invention comprises: first and second first-conductivity type transistors for signal input, the first and second first-conductivity type transistors respectively receiving at gates complementary first and second input signals generated using a first voltage supply as a power supply and having ends connected to a ground and the other ends connected to first and second nodes, respectively; cross-coupled first and second second-conductivity type transistors having ends connected to a second voltage supply and the other ends connected to the first and second nodes, respectively; and a current interrupter for interrupting a through current by disconnecting the second voltage supply from the first or second second-conductivity type transistor when the levels of the input signals change, wherein the current interrupter includes a third second-conductivity type transistor provided between the second voltage supply and the first second-conductivity type transistor and a fourth second-conductivity type transistor provided between the second voltage supply and the second second-conductivity type transistor, the level shifter further includes a fifth second-conductivity type transistor connected between a connection point of the first and third second-conductivity type transistors and a connection point of the second and fourth second-conductivity type transistors, an OFF leakage generation circuit formed by a third-first-conductivity type transistor having an end and gate connected to the ground and the other end connected to the third node, and a sixth second-conductivity type transistor having an end connected to the second voltage supply and the other end and gate connected to the third node, and the gate of the fifth second-conductivity type transistor is connected to the third node.

A level shifter of the present invention comprises: first and second first-conductivity type transistors for signal input, the first and second first-conductivity type transistors respectively receiving at gates complementary first and second input signals generated using a first voltage supply as a power supply and having ends connected to a ground and the other ends connected to first and second nodes, respectively; a power supply circuit having an end connected to a second voltage supply and the other end connected to the first and second nodes, the power supply circuit supplying a voltage of the second voltage supply to one of the first and second nodes while interrupting the supply of the voltage of the second voltage supply to the other node; a flip flop circuit for receiving potentials of the first and second nodes as inputs; a disconnection circuit inserted between the first and second first-conductivity type transistors and the ground for disconnecting the first and second first-conductivity type transistors from the ground; an OFF leakage generation circuit formed by a third first-conductivity type transistor having an end and gate connected to the ground and the other end connected to the third node; a first second-conductivity type transistor connected between the first node and the second node; and a second second-conductivity type transistor having an end connected to a second voltage supply and the other end and gate connected to the third node, wherein the gate of the first second-conductivity type transistor is connected to the third node.

In one embodiment of the level shifter of the present invention, the first, second and third first-conductivity type transistors are set to have a same threshold voltage which is lower than those of the other transistors.

In one embodiment of the level shifter of the present invention, the third, fourth and fifth first-conductivity type transistors are set to have a same threshold voltage which is lower than those of the other transistors.

In one embodiment of the level shifter of the present invention, the level shifter further comprises: a first first-conductivity type high voltage transistor provided between the first first-conductivity type transistor and the first node; a second first-conductivity type high voltage transistor provided between the second first-conductivity type transistor and the second node; and a third first-conductivity type high voltage transistor provided between the third first-conductivity type transistor and the third node, wherein the first, second and third first-conductivity type transistors are formed by low voltage transistors, and gates of the first, second and third first-conductivity type high voltage transistors are controlled such that a potential equal to or greater than a peak inverse voltage of the low voltage transistor is prevented from being input to the first, second and third first-conductivity type transistors.

In one embodiment of the level shifter of the present invention, the level shifter further comprises: a first first-conductivity type high voltage transistor provided between the third first-conductivity type transistor and the gate of the second second-conductivity type transistor; a second first-conductivity type high voltage transistor provided between the fourth first-conductivity type transistor and the gate of the first second-conductivity type transistor; and a third first-conductivity type high voltage transistor provided between the fifth first-conductivity type transistor and the third node, wherein the third, fourth and fifth first-conductivity type transistors are formed by low voltage transistors, and gates of the first, second and third first-conductivity type high voltage transistors are controlled such that a potential equal to or greater than a peak inverse voltage of the low voltage transistor is prevented from being input to the third, fourth and fifth first-conductivity type transistors.

In one embodiment of the level shifter of the present invention, the gate of the first first-conductivity type high voltage transistor is connected to a gate of the first first-conductivity type transistor; the gate of the second first-conductivity type high voltage transistor is connected to a gate of the second first-conductivity type transistor; and the gate of the third first-conductivity type high voltage transistor is connected to the ground.

In one embodiment of the level shifter of the present invention, the gate of the first first-conductivity type high voltage transistor is connected to a gate of the third first-conductivity type transistor; the gate of the second first-conductivity type high voltage transistor is connected to a gate of the fourth first-conductivity type transistor; and the gate of the third first-conductivity type high voltage transistor is connected to the ground.

In one embodiment of the level shifter of the present invention, the current conversion circuit outputs a current equivalent to or greater than an OFF leakage current generated when the first and second first-conductivity type transistors are OFF.

In one embodiment of the level shifter of the present invention, the current conversion circuit outputs a current equivalent to or greater than an OFF leakage current generated when the third and fourth first-conductivity type transistors are OFF.

In one embodiment of the level shifter of the present invention, the level shifter further comprises a resistor between the third node and the ground.

In one embodiment of the level shifter of the present invention, the level shifter further comprises a disconnection circuit, wherein when the first voltage supply is shut down, the disconnection circuit disconnects the OFF leakage generation circuit from the current conversion circuit while stopping a level shift function.

A level shift device of the present invention comprises a plurality of level shifters, each of which is the above-described level shifter, wherein the OFF leakage generation circuit included in each of the level shifters and a second-conductivity type transistor for generating a bias potential of a current mirror are shared among the plurality of level shifters.

Thus, in a level shifter of the present invention, even if a large OFF leakage current is generated when the first or second first-conductivity type transistor is OFF, an OFF leakage generation circuit and current conversion circuit supply a current equivalent to or greater than the generated OFF leakage current from higher voltage supply VDD3 to a first or second node. Therefore, the conventional problem of the first and second nodes decreasing from a potential equal to higher voltage supply VDD3 is dismissed. The connections between the first and second nodes and the second voltage supply can be realized with high resistance, while the first and second first-conductivity type transistors can be set to have low threshold voltages. Therefore, the level shifter is operable even when the first voltage supply is a further lowered voltage.

Especially, according to the present invention, no current is supplied from the second voltage supply when the first or second node is connected to the ground. Therefore, the level shifter operates with smaller current consumption.

According to the present invention, in a structure where a resistor is added to the level shifter in order to realize quick decrease in potential at a predetermined node, the resistor can be formed by part of a cancellation circuit for canceling the OFF leakage current. Therefore, the layout area is reduced.

According to the present invention, during a predetermined time period after the connection of the gate of the first or second second-conductivity type transistor is switched from the ground to the second voltage supply, the potential at the gate of the first or second second-conductivity type transistor is quickly increased by a sixth or seventh second-conductivity type transistor and a corresponding delay circuit even if the third and fourth second-conductivity type transistors have high resistance while they are ON. Therefore, the level shift operation is carried out more quickly.

DESCRIPTION OF THE PREFERRED EMBODIMENTS

Hereinafter, embodiments of the present invention will be described with reference to the drawings.

EMBODIMENT 1

Figure 1:
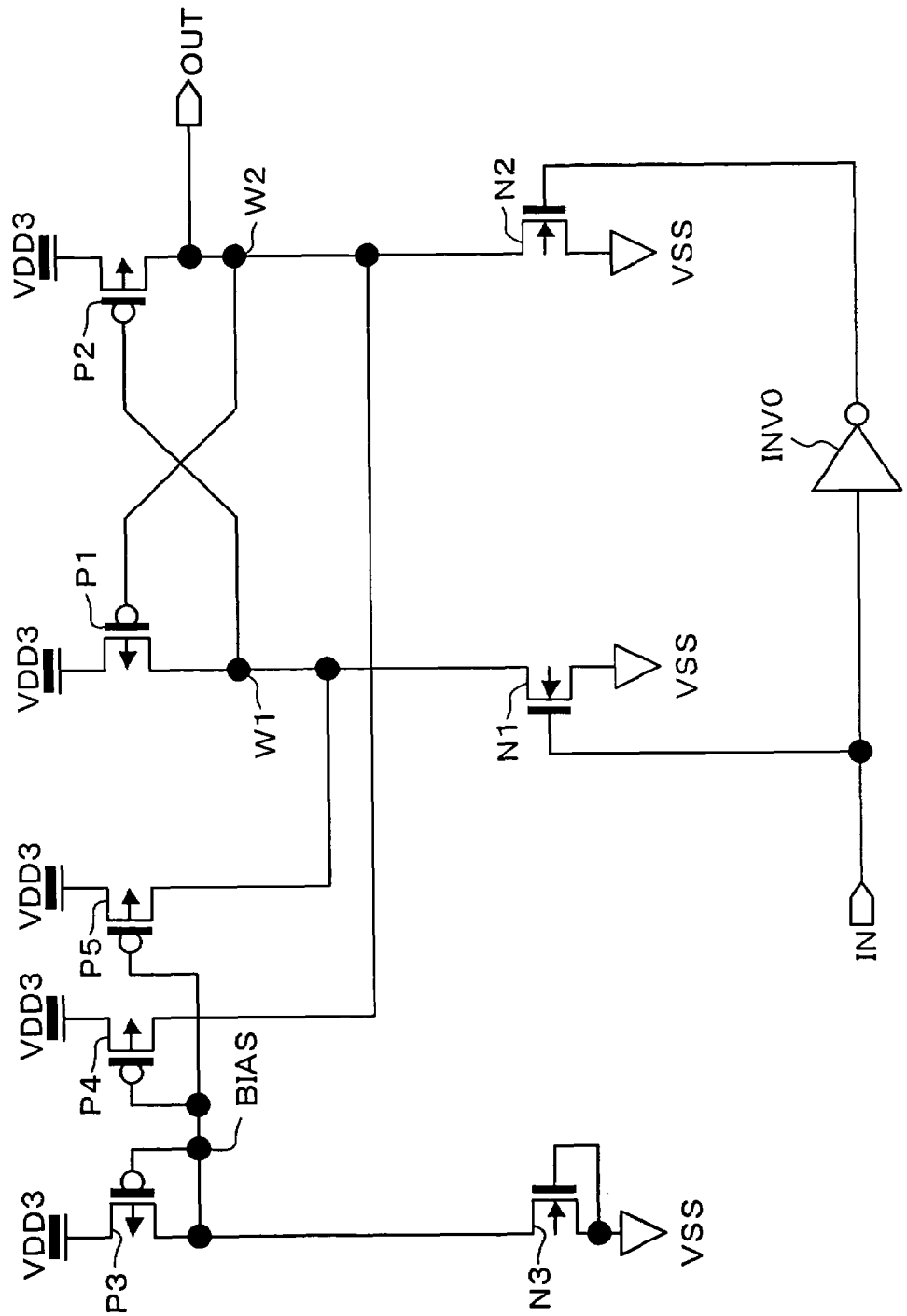
FIG. 1 shows a structure of a level shifter according to embodiment 1 of the present invention.

FIG. 1 shows a specific structure of a level shifter according to embodiment 1.

In FIG. 1, a terminal IN is a signal input terminal, an element INV0 is an inverter formed by a lower voltage side element for inverting a signal input through the input terminal IN. The inverter INV0 operates with lower voltage supply (first voltage supply) VDD of, for example, 1.5 V.

In FIG. 1, the elements other than the inverter INV0 are elements on the higher voltage side at, for example, 3.3 V. The level shifter includes a pair of N-type transistors N1 and N2 for complementary signal input, which has sources connected to the ground. The gate of the N-type transistor N1 (first first-conductivity type transistor) receives a signal input through the input terminal IN (one of complementary first and second input signals). The gate of the N-type transistor N2 (second first-conductivity type transistor) receives an output signal of the inverter INV0 (the other of the complementary first and second input signals).

The level shifter of FIG. 1 also includes a pair of P-type transistors P1 and P2 having sources connected to higher voltage supply (second voltage supply) VDD3, gates cross-coupled to drains of each other, and the drains connected to the drains of the N-type transistors N1 and N2 for signal input, respectively. The connection point of the P-type transistor (first second-conductivity type transistor) P1 and the N-type transistor N1 is a node W1. The connection point of the P-type transistor (second second-conductivity type transistor) P2 and the N-type transistor N2 is a node W2. The node W2 is connected to an output terminal OUT.

The level shifter of FIG. 1 also includes an N-type transistor N3 whose source and gate are connected to the ground. The N-type transistor (third first-conductivity type transistor) N3 has the same characteristics as those exhibited when a signal having a potential equal to the ground (L level) is input to the gates of the N-type transistors N1 and N2 and constitutes an OFF leak generation circuit.

The level shifter of FIG. 1 also includes P-type transistors P3, P4 and P5 having sources connected to higher voltage supply VDD3 and gates coupled together. The drain and gate of the P-type transistor P3 and the drain of the N-type transistor N3 are coupled together at a node BIAS. The drain of the P-type transistor P4 is connected to the node W2. The drain of the P-type transistor P5 is connected to the node W1. The P-type transistors P3, P4 and P5 function as a current mirror and constitute a current conversion circuit which converts an OFF leakage current generated by the N-type transistor N3 to a current flowing from higher voltage supply (second voltage supply) VDD3 and amplifies the converted current by a predetermined factor to output the amplified current to the nodes W1 and W2.

Hereinafter, an operation of the level shifter having the above-described structure is described. First, during a stationary state where the potential of the signal at the input terminal IN is at H (VDD) level, the N-type transistor N1 is ON, the N-type transistor N2 is OFF, the P-type transistor P1 is OFF, and the P-type transistor P2 is ON. An OFF leakage current flowing through the N-type transistor N3 also flows to the drain of the P-type transistor P3, and the bias potential of the current mirror circuit is output to the node BIAS. A current flowing from the P-type transistor P4, which is defined according to the current flowing through the drain of the P-type transistor P3, is output to the node W2. Likewise, a current flowing from the P-type transistor P5, which is defined according to the current flowing through the drain of the P-type transistor P3, is output to the node W1.

In this case, an OFF leakage current is flowing through the drain of the N-type transistor N2 even though the N-type transistor N2 is OFF. In view of such, in the level shifter of FIG. 1, the P-type transistors P3 and P4, which constitute a current mirror, are each set to have a transistor size such that a current equivalent to the OFF leakage current flowing through the N-type transistor N2, or a current greater than the OFF leakage current flowing through the N-type transistor N2 by an appropriate margin, flows therethrough. With this structure, the OFF leakage current flowing through the N-type transistor N2 is canceled by the equivalent or greater current flowing from the P-type transistor P4 so that the potential of the node W2 is fixed to a potential equal to higher voltage supply VDD3. Further, to enable the level shifter to operate even when lower voltage supply VDD is further lowered, the gate width of the P-type transistor P2 is decreased while the gate length of the P-type transistor P2 is increased. Even if the ON resistance is increased, the potential of the node W2 does not decrease because the current equivalent to or greater than the OFF leakage current flowing through the N-type transistor N2 is supplied from the P-type transistor P4 to the node W2. Furthermore, the N-type transistors N2 and N3 are set to have the same threshold voltage. With this arrangement, even when the N-type transistor N2 is set to have a low threshold voltage and the OFF leakage current flowing through the N-type transistor N2 is increased due to a variation in temperature or production process, the OFF leakage current flowing through the N-type transistor N3 increases in proportion to the increase of the OFF leakage current flowing through the N-type transistor N2, and the currents flowing through the P-type transistors P3 and P4 also increase in proportion to the OFF leakage current flowing through the N-type transistor N3. Thus, the potential of the node W2 is prevented from decreasing.

Contrary to the above, during a stationary state where the potential of the signal at the input terminal IN is at L (VSS) level, the N-type transistor N1 is OFF, the N-type transistor N2 is ON, the P-type transistor P1 is ON, and the P-type transistor P2 is OFF. As in the case of the input terminal IN being at H (VDD) level, a current flowing from the P-type transistor P4, which is defined according to the current flowing through the drain of the P-type transistor P3, is output to the node W2. Likewise, a current flowing from the P-type transistor P5, which is defined according to the current flowing through the drain of the P-type transistor P3, is output to the node W1.

In this case, a leakage current (OFF leakage current) is flowing through the drain of the N-type transistor N1 even though the N-type transistor N1 is OFF. In view of such, in the level shifter of FIG. 1, the P-type transistors P3 and P5, which constitute a current mirror, are each set to have a transistor size such that a current equivalent to the OFF leakage current flowing through the N-type transistor N1, or a current greater than the OFF leakage current flowing through the N-type transistor N1 by an appropriate margin, flows therethrough. With this structure, the OFF leakage current flowing through the N-type transistor N1 is canceled by the equivalent or greater current flowing from the P-type transistor P5 so that the potential of the node W1 is fixed to a potential equal to higher voltage supply VDD3. Further, to enable the level shifter to operate even when lower voltage supply VDD is further lowered, the gate width of the P-type transistor P1 is decreased while the gate length of the P-type transistor P1 is increased. Even if the ON resistance is increased, the potential of the node W1 does not decrease because the current equivalent to or greater than the OFF leakage current flowing through the N-type transistor N1 is supplied from the P-type transistor P5 to the node W1. Furthermore, the N-type transistors N1 and N3 are set to have the same threshold voltage. With this arrangement, even when the N-type transistor N1 is set to have a low threshold voltage and the OFF leakage current flowing through the N-type transistor N1 is increased due to a variation in temperature or production process, the OFF leakage current flowing through the N-type transistor N3 increases in proportion to the increase of the OFF leakage current flowing through the N-type transistor N1, and the currents flowing through the P-type transistors P3 and P5 also increase in proportion to the OFF leakage current flowing through the N-type transistor N3. Thus, the potential of the node W1 is prevented from decreasing.

In view of the above, the N-type transistors N1, N2 and N3 are desirably set to have the same threshold voltage. The transistor sizes of the P-type transistors P3 and P4, which constitute a current mirror, are desirably set so as to amplify the OFF leakage current flowing through the N-type transistor N3 such that the output of the P-type transistor P4 is equivalent to or greater than the OFF leakage current flowing through the N-type transistor N2. The transistor sizes of the P-type transistors P3 and P5, which constitute a current mirror, are desirably set so as to amplify the OFF leakage current flowing through the N-type transistor N3 such that the output of the P-type transistor P5 is equivalent to or greater than the OFF leakage current flowing through the N-type transistor N1. The N-type transistors N1, N2 and N3 are desirably located in the vicinity of each other such that differences in characteristics due to a variation in temperature or production process become small.

Thus, with the above settings of embodiment 1, during a stationary state where the potential of the node W1 or W2 is at H (VDD3) level, the potential of the node W1 or W2 is surely fixed to a potential equal to higher voltage supply VDD3 even when the P-type transistors P1 and P2 have large ON resistance values and the N-type transistors N1, N2 and N3 have a low threshold voltage. Therefore, the level shifter is operable even when lower voltage supply VDD is a low voltage.

(First Variation)

Figure 2:
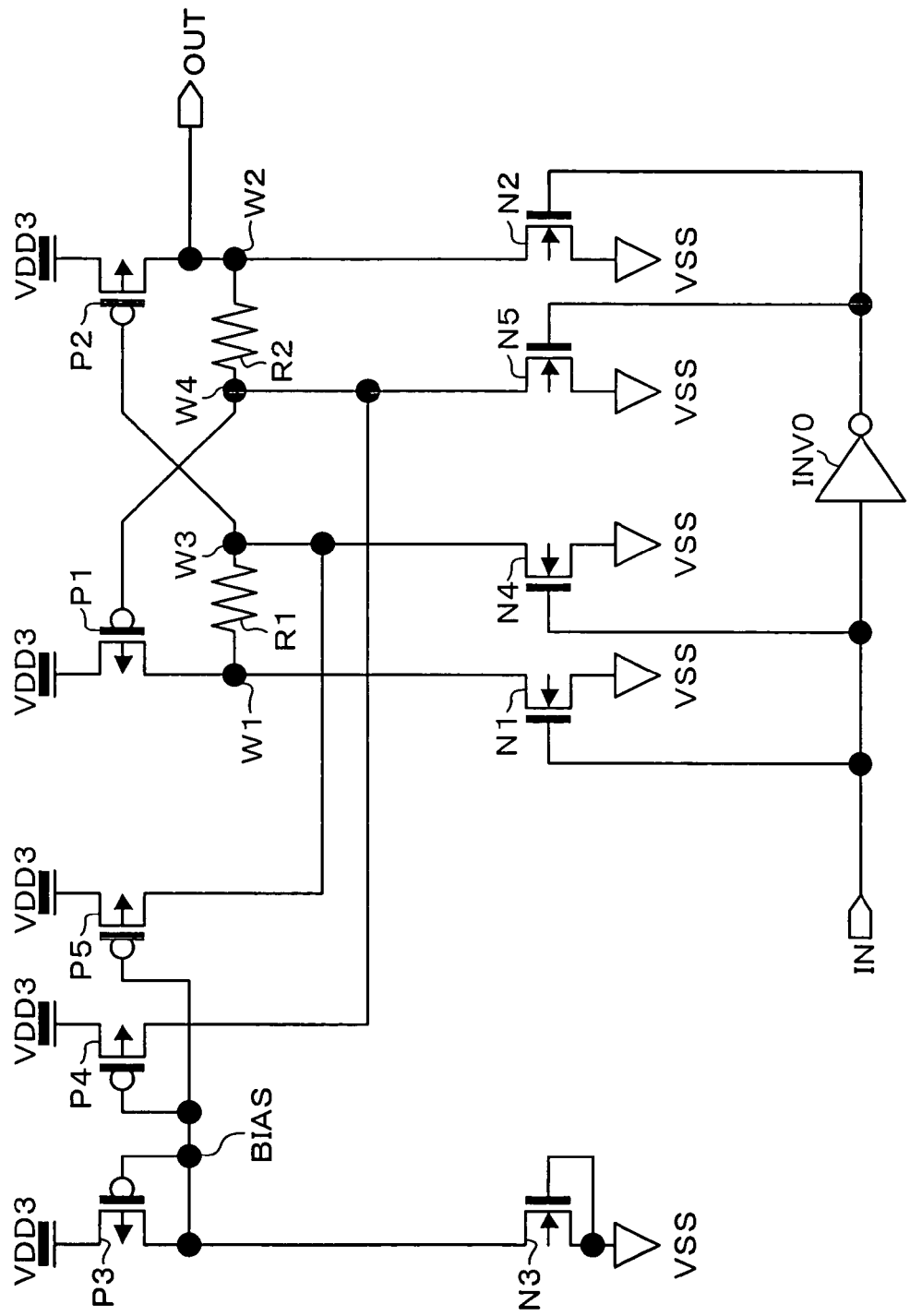
FIG. 2 shows a first variation of the level shifter of embodiment 1.

FIG. 2 shows the first variation of embodiment 1.

The first variation is different from the above-described example of embodiment 1 in that the N-type transistors N1 and N2 and the nodes W1 and W2 are each divided into two elements. The level shifter of FIG. 2 includes N-type transistors N4 and N5. The N-type transistor N4 and N-type transistor N1 of FIG. 2 constitute a transistor pair which corresponds to the N-type transistor N1 of FIG. 1. The sources and gates of the N-type transistors N4 and N1 are respectively coupled together. The N-type transistor N5 and N-type transistor N2 of FIG. 2 constitute a transistor pair which corresponds to the N-type transistor N2 of FIG. 1. The sources and gates of the N-type transistors N5 and N2 are respectively coupled together. The resistor R1 is provided between the node W1 and the gate of the P-type transistor P2. The resistor R2 is provided between the node W2 and the gate of the P-type transistor P1. The drain of the N-type transistor (a half of the first first-conductivity type transistor) N4 is connected to the gate of the P-type transistor P2 and the connection point therebetween is a node W3 (a half of the node W1 of FIG. 1). The drain of the N-type transistor (a half of the second first-conductivity type transistor) N5 is connected to the gate of the P-type transistor P1 and the connection point therebetween is a node W4 (a half of the node W2 of FIG. 1). The drain of the P-type transistor P4 is connected to the node W4. The drain of the P-type transistor P5 is connected to the node W3.

Hereinafter, an operation of the level shifter having the above-described structure is described. First, during a stationary state where the potential of the signal at the input terminal IN is at H (VDD) level, the N-type transistors N1 and N4 are ON, N-type transistors N2 and N5 are OFF, the P-type transistor P1 is OFF, and the P-type transistor P2 is ON. OFF leakage currents flowing from the P-type transistors P4 and P5, which are defined according to the OFF leakage current of the N-type transistor N3, are output to the nodes W4 and W3, respectively.

In this case, an OFF leakage current is flowing through the drain of the N-type transistor N5 even though the N-type transistor N5 is OFF. In view of such, in the level shifter of FIG. 2, the P-type transistors P3 and P4, which constitute a current mirror, are each set to have a transistor size such that a current equivalent to the OFF leakage current flowing through the N-type transistor N5, or a current greater than the OFF leakage current flowing through the N-type transistor N5 by an appropriate margin, flows therethrough. With this structure, the OFF leakage current flowing through the N-type transistor N5 is canceled by the equivalent or greater current flowing from the P-type transistor P4 so that the potential of the node W4 is fixed to a potential equal to higher voltage supply VDD3. Further, even when the resistor R2 has a large resistance value such that the level shifter is operable even when lower voltage supply VDD is further lowered, the potential of the node W4 does not decrease because the current equivalent to or greater than the OFF leakage current flowing through the N-type transistor N5 is supplied from the P-type transistor P4 to the node W4. Furthermore, the N-type transistors N5 and N3 are set to have the same threshold voltage. With this arrangement, even when the OFF leakage current flowing through the N-type transistor N5 is increased due to a variation in temperature or production process, the OFF leakage current flowing through the N-type transistor N3 increases in proportion to the increase of the OFF leakage current flowing through the N-type transistor N5, and the currents flowing through the P-type transistors P3 and P4 also increase in proportion to the OFF leakage current flowing through the N-type transistor N3. Thus, the potential of the node W4 is prevented from decreasing.

Even during a stationary state where the potential of the signal at the input terminal IN is at L (VSS) level contrary to the above, the principle of operation is the same, and therefore, the description thereof is herein omitted.

In view of the above, the N-type transistors N4, N5 and N3 are desirably set to have the same threshold voltage. The transistor sizes of the P-type transistors P3 and P4, which constitute a current mirror, are desirably set so as to amplify the OFF leakage current flowing through the N-type transistor N3 such that the output of the P-type transistor P4 is equivalent to or greater than the OFF leakage current flowing through the N-type transistor N5. The transistor sizes of the P-type transistors P3 and P5, which constitute a current mirror, are desirably set so as to amplify the OFF leakage current flowing through the N-type transistor N3 such that the output of the P-type transistor P5 is equivalent to or greater than the OFF leakage current flowing through the N-type transistor N4. The N-type transistors N4, N5 and N3 are desirably located in the vicinity of each other such that differences in characteristics due to a variation in temperature or production process become small. With the above settings, during a stationary state where the node W3 or W4 is at H (VDD3) level, the potential of the node W3 or W4 is surely fixed to a potential equal to higher voltage supply VDD3 even when the resistors R1 and R2 have large resistance values and the N-type transistors N4, N5 and N3 have a low threshold voltage. Thus, the level shifter is operable even when lower voltage supply VDD is a low voltage.

(Second Variation)

Figure 3:
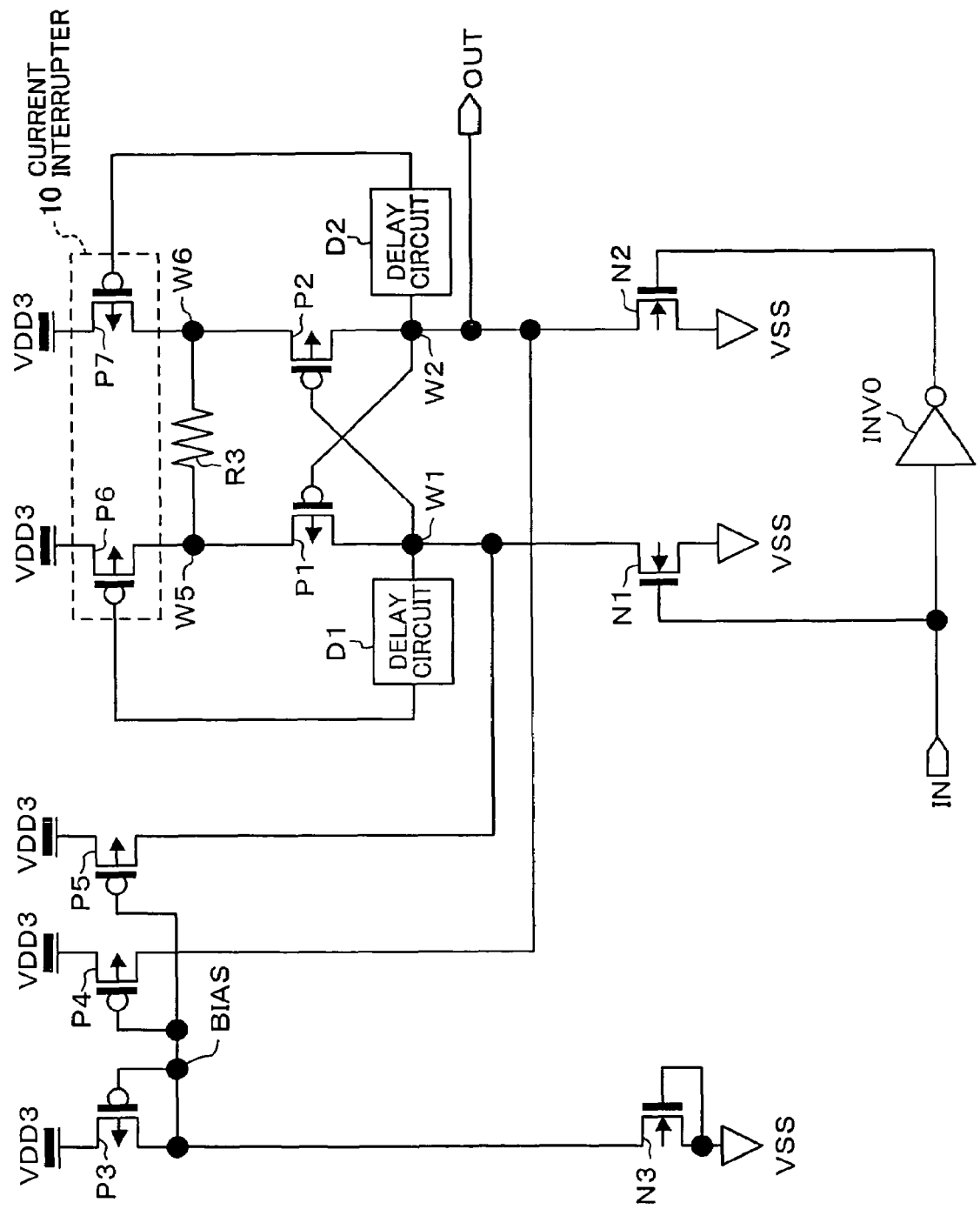
FIG. 3 shows a second variation of the level shifter of embodiment 1.

FIG. 3 shows the second variation of embodiment 1.

The second variation is different from the above-described example of embodiment 1 in that the level shifter of the second variation further includes a current interrupter for interrupting a through current when the level of input signal IN varies. The level shifter of FIG. 3 includes P-type transistors P6 and P7 for current interruption, which are provided between higher voltage supply VDD3 and the P-type transistors P1 and P2, respectively. The sources of the P-type transistors P6 and P7 are connected to higher voltage supply VDD3, and the drains of the P-type transistors P6 and P7 are connected to the sources of the P-type transistors P1 and P2, respectively, and constitute a current interrupter 10. The P-type transistor P6 for current interruption and the P-type transistor P1 are connected at a node W5. The P-type transistor P7 for current interruption and the P-type transistor P2 are connected at a node W6. The gate of the P-type transistor P6 is connected to the node W1 through a delay circuit D1. The gate of the P-type transistor P7 is connected to the node W2 through a delay circuit D2. The level shifter further includes a pull-up resistor R3, one end of which is connected to the node W5, and the other end being connected to the node W6.

Hereinafter, an operation of the level shifter having the above-described structure is described. First, during a stationary state where the potential of the signal at the input terminal IN is at H (VDD) level, the N-type transistor N1 is ON, N-type transistor N2 is OFF, the P-type transistors P1 and P7 are OFF, and the P-type transistors P2 and P6 are ON. Currents flowing from the P-type transistors P4 and P5, which are defined according to the OFF leakage current of the N-type transistor N3, are output to the nodes W1 and W2, respectively. The node W2 is pulled up through the P-type transistor P2, the resistor R3, and the P-type transistor P6.

In this case, an OFF leakage current is flowing through the drain of the N-type transistor N2 even though the N-type transistor N2 is OFF. In view of such, in the level shifter of FIG. 3, the P-type transistors P3 and P4, which constitute a current mirror, are each set to have a transistor size such that a current equivalent to the OFF leakage current flowing through the N-type transistor N2, or a current greater than the OFF leakage current flowing through the N-type transistor N2 by an appropriate margin, flows therethrough. With this structure, the OFF leakage current flowing through the N-type transistor N2 is canceled by the equivalent or greater current flowing from the P-type transistor P4 so that the potential of the node W2 is fixed to a potential equal to higher voltage supply VDD3. Further, even when the resistor R3 has a large resistance value such that the level shifter is operable even when lower voltage supply VDD is further lowered, the potential of the node W2 does not decrease because the current equivalent to or greater than the OFF leakage current flowing through the N-type transistor N2 is supplied from the P-type transistor P4 to the node W2. Furthermore, the N-type transistors N2 and N3 are set to have the same threshold voltage. With this arrangement, even when the N-type transistor N2 is set to have a low threshold voltage and the OFF leakage current flowing through the N-type transistor N2 is increased due to a variation in temperature or production process, the OFF leakage current flowing through the N-type transistor N3 increases in proportion to the increase of the OFF leakage current flowing through the N-type transistor N2, and the currents flowing through the P-type transistors P3 and P4 also increase in proportion to the OFF leakage current flowing through the N-type transistor N3. Thus, the potential of the node W2 is prevented from decreasing.

Even during a stationary state where the potential of the signal at the input terminal IN is at L (VSS) level contrary to the above, the principle of operation is the same, and therefore, the description thereof is herein omitted. At the state transitions where the signal at the input terminal IN transitions from L (VSS) level to H (VDD) level and where the signal at the input terminal IN transitions from H (VDD) level to L (VSS) level, the operations in these cases are not the essential part of the present invention, and therefore, the descriptions thereof are herein omitted.

In view of the above, the N-type transistors N1, N2 and N3 are desirably set to have the same threshold voltage. The transistor sizes of the P-type transistors P3 and P4, which constitute a current mirror, are desirably set so as to amplify the OFF leakage current flowing through the N-type transistor N3 such that the output of the P-type transistor P4 is equivalent to or greater than the OFF leakage current flowing through the N-type transistor N2. The transistor sizes of the P-type transistors P3 and P5, which constitute a current mirror, are desirably set so as to amplify the OFF leakage current flowing through the N-type transistor N3 such that the output of the P-type transistor P5 is equivalent to or greater than the OFF leakage current flowing through the N-type transistor N1. The N-type transistors N1, N2 and N3 are desirably located in the vicinity of each other such that differences in characteristics due to a variation in temperature or production process become small. With the above settings, during a stationary state where the node W1 or W2 is at H (VDD3) level, the potential of the node W1 or W2 is surely fixed to a potential equal to higher voltage supply VDD3 even when the resistor R3 has a large resistance value and the N-type transistors N1, N2 and N3 have a low threshold voltage. Thus, the level shifter is operable even when lower voltage supply VDD is a low voltage. It should be noted that the resistor R3 is omittable so long as the nodes W1 and W2 are supplied with appropriate currents from the P-type transistors P4 and P5, respectively, i.e., so long as the nodes W1 and W2 are pulled up.

(Third Variation)

Figure 4:
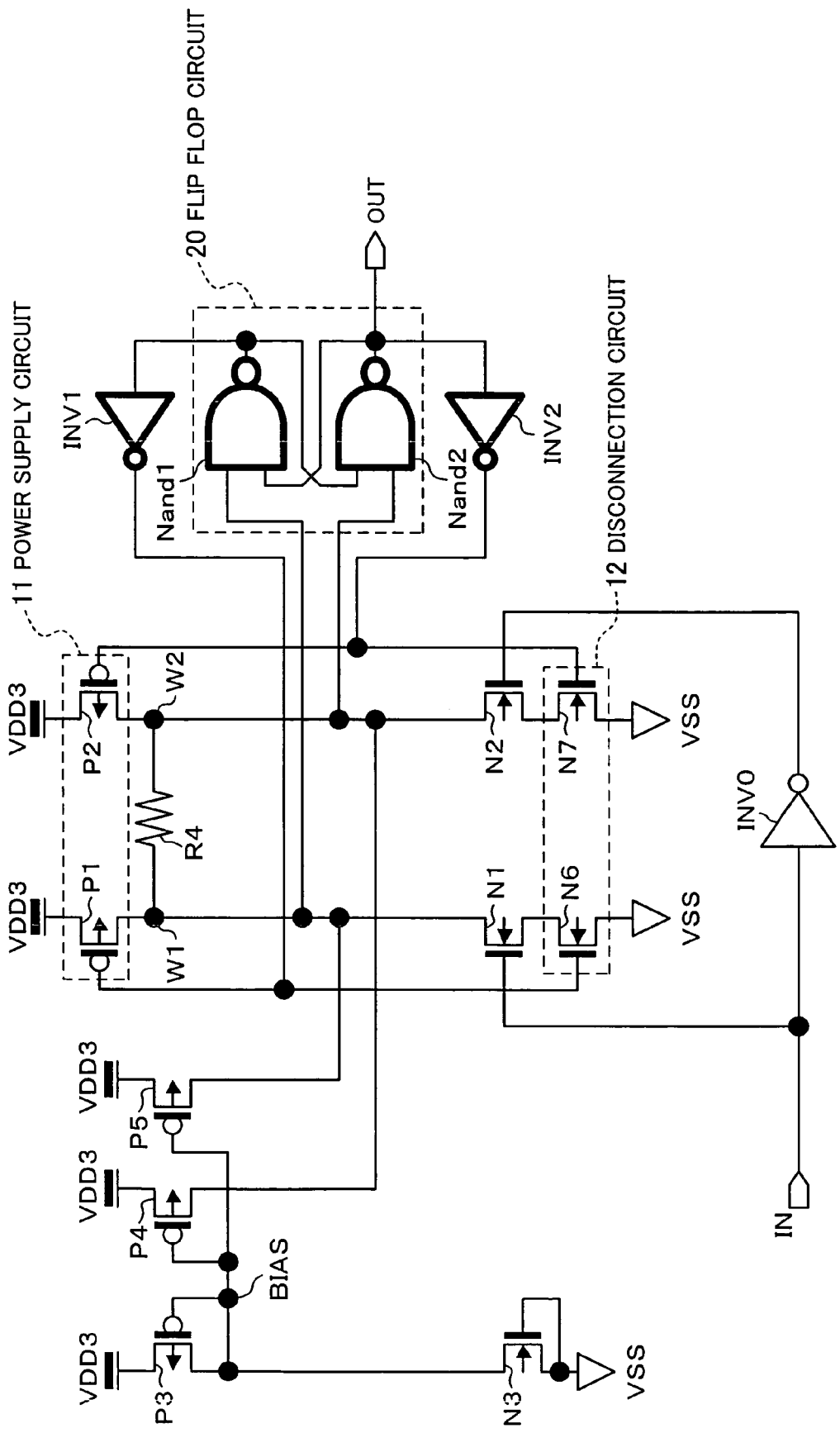
FIG. 4 shows a third variation of the level shifter of embodiment 1.

FIG. 4 shows the third variation of embodiment 1.

The third variation is different from the above-described example of embodiment 1 in that the level shifter of the third variation employs a different connection design for the P-type transistors P1 and P2. The level shifter of FIG. 4 includes N-type transistors N6 and N7 between the ground and the N-type transistors N1 and N2, respectively, for disconnecting the N-type transistors N1 and N2 from the ground. The N-type transistors N6 and N7 constitute a disconnection circuit 12. The sources of the N-type transistors N6 and N7 are connected to the ground, and the drains of the N-type transistors N6 and N7 are connected to the sources of the N-type transistors N1 and N2, respectively. The P-type transistors P1 and P2 constitute a power supply circuit 11. The gate of the P-type transistor P1 is connected to the gate of the N-type transistor N6. The gate of the P-type transistor P2 is connected to the gate of the N-type transistor N7.

The level shifter further includes NAND circuits Nand1 and Nand2, each of which is a 2-input NAND circuit. The NAND circuit Nand1 receives output signals of the node W1 and the NAND circuit Nand2. The NAND circuit Nand2 receives output signals of the node W2 and the NAND circuit Nand1. With such a structure, the NAND circuits Nand1 and Nand2 constitute a flip flop circuit 20 which operates based on the potentials of the nodes W1 and W2. The level shifter further includes inverters INV1 and INV2. The inverter INV1 inverts the output signal of the NAND circuit Nand1 and outputs the inverted signal to the gate of the P-type transistor P1 and the gate of the N-type transistor N6. The inverter INV2 inverts the output signal of the NAND circuit Nand2 and outputs the inverted signal to the gate of the P-type transistor P2 and the gate of the N-type transistor N7. The level shifter further includes a pull-up resistor R4, one end of which is connected to the node W1, and the other end being connected to the node W2. The output terminal OUT is connected to the output of the NAND circuit Nand2.

Hereinafter, an operation of the level shifter having the above-described structure is described. First, during a stationary state where the potential of the signal at the input terminal IN is at H (VDD) level, the N-type transistors N1 and N7 are ON, the N-type transistors N2 and N6 are OFF, the P-type transistor P1 is ON, and the P-type transistor P2 is OFF. Currents flowing from the P-type transistors P4 and P5, which are defined according to the OFF leakage current of the N-type transistor N3, are output to the nodes W1 and W2, respectively. The node W2 is pulled up through the resistor R4 and the P-type transistor P1. Each of the NAND circuit Nand1 and the inverter INV2 outputs H (VDD3) level. Each of the NAND circuit Nand2 and the inverter INV1 outputs L (VSS) level.

In this case, an OFF leakage current is flowing through the drain of the N-type transistor N2 even though the N-type transistor N2 is OFF. In view of such, in the level shifter of FIG. 4, the P-type transistors P3 and P4, which constitute a current mirror, are each set to have a transistor size such that a current equivalent to the OFF leakage current flowing through the N-type transistor N2, or a current greater than the OFF leakage current flowing through the N-type transistor N2 by an appropriate margin, flows therethrough. With this structure, the OFF leakage current flowing through the N-type transistor N2 is canceled by the equivalent or greater current flowing from the P-type transistor P4 so that the potential of the node W2 is fixed to a potential equal to higher voltage supply VDD3. Further, even when the resistor R4 has a large resistance value such that the level shifter is operable even when lower voltage supply VDD is further lowered, the potential of the node W2 does not decrease because the current equivalent to or greater than the OFF leakage current flowing through the N-type transistor N2 is supplied from the P-type transistor P4 to the node W2. Furthermore, the N-type transistors N2 and N3 are set to have the same threshold voltage. With this arrangement, even when the N-type transistor N2 is set to have a low threshold voltage and the OFF leakage current flowing through the N-type transistor N2 is increased due to a variation in temperature or production process, the OFF leakage current flowing through the N-type transistor N3 increases in proportion to the increase of the OFF leakage current flowing through the N-type transistor N2, and the currents flowing through the P-type transistors P3 and P4 also increase in proportion to the OFF leakage current flowing through the N-type transistor N3. Thus, the potential of the node W2 is prevented from decreasing.

Even during a stationary state where the potential of the signal at the input terminal IN is at L (VSS) level contrary to the above, the principle of operation is the same, and therefore, the description thereof is herein omitted. At the state transitions where the signal at the input terminal IN transitions from L (VSS) level to H (VDD) level and where the signal at the input terminal IN transitions from H (VDD) level to L (VSS) level, the operations in these cases are not the essential part of the present invention, and therefore, the descriptions thereof are herein omitted.

In view of the above, the N-type transistors N1, N2 and N3 are desirably set to have the same threshold voltage. The transistor sizes of the P-type transistors P3 and P4, which constitute a current mirror, are desirably set so as to amplify the OFF leakage current flowing through the N-type transistor N3 such that the output of the P-type transistor P4 is equivalent to or greater than the OFF leakage current flowing through the N-type transistor N2. The transistor sizes of the P-type transistors P3 and P5, which constitute a current mirror, are desirably set so as to amplify the OFF leakage current flowing through the N-type transistor N3 such that the output of the P-type transistor P5 is equivalent to or greater than the OFF leakage current flowing through the N-type transistor N1. The N-type transistors N1, N2 and N3 are desirably located in the vicinity of each other such that differences in characteristics due to a variation in temperature or production process become small. With the above settings, the potential of the node W1 or W2 is surely fixed to a potential equal to higher voltage supply VDD3 even when the resistor R4 has a large resistance value and the N-type transistors N1, N2 and N3 have a low threshold voltage. Thus, the level shifter is operable even when lower voltage supply VDD is a low voltage. It should be noted that the resistor R4 is omittable so long as the nodes W1 and W2 are supplied with appropriate currents from the P-type transistors P4 and P5, respectively, i.e., so long as the nodes W1 and W2 are pulled up.

EMBODIMENT 2

Figure 5:
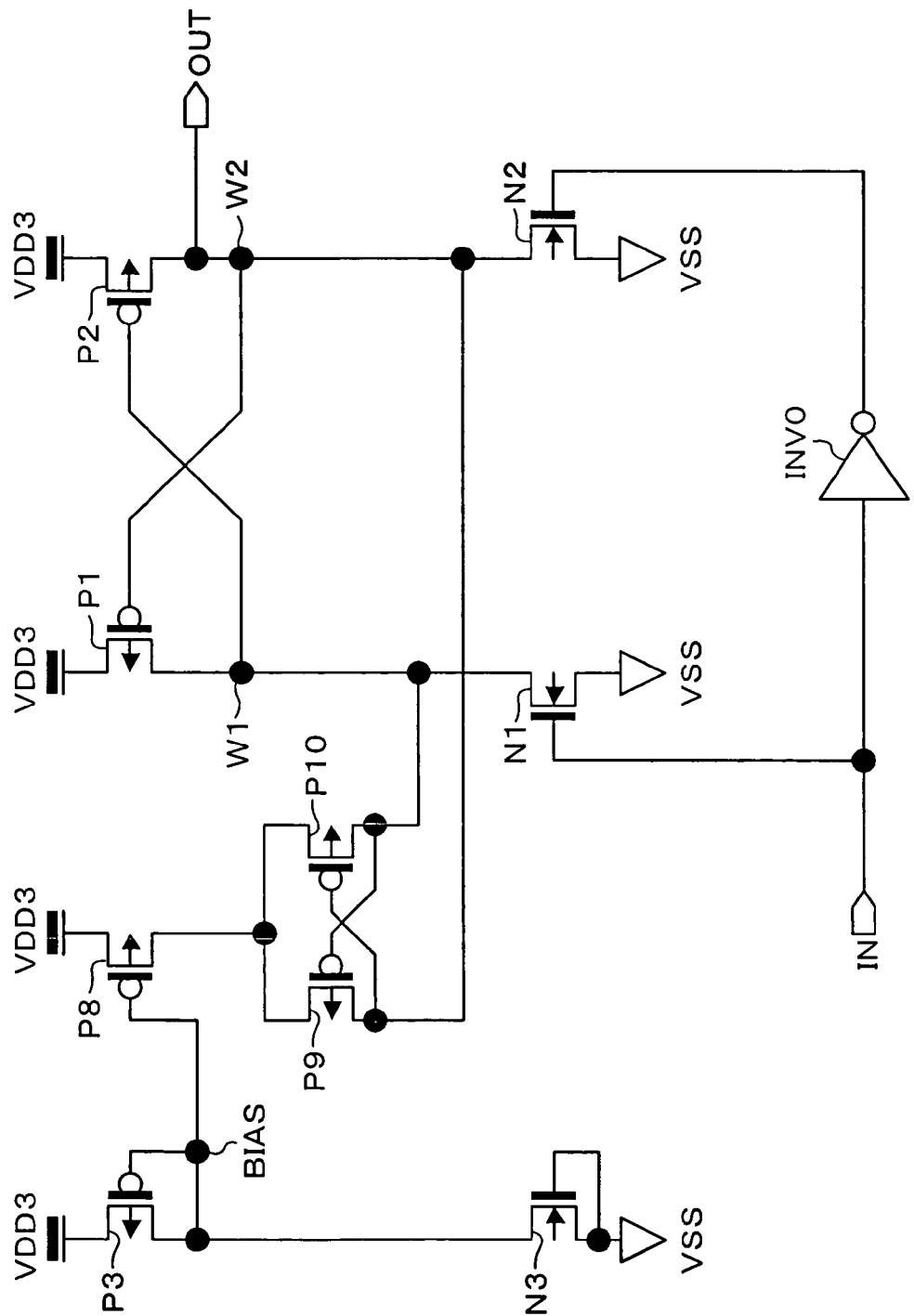
FIG. 5 shows a structure of a level shifter according to embodiment 2 of the present invention.

FIG. 5 shows a specific structure of a level shifter of embodiment 2.

The level shifter of FIG. 5 includes, in addition to the components of the level shifter of FIG. 1 of embodiment 1, a P-type transistor P8 which is provided in place of the P-type transistors P4 and P5. The source of the P-type transistor P8 is connected to higher voltage supply VDD3. The gate of the P-type transistor P8 is connected to the node BIAS. The P-type transistor P8 cooperates with the P-type transistor P3 as a current mirror and forms a current conversion circuit which amplifies the OFF leakage current flowing through the N-type transistor N3 by a predetermined factor to generate a current flowing from higher voltage supply VDD3. The level shifter of FIG. 5 further includes P-type transistors P9 and P10 which constitute a switch circuit for connecting the drain of the P-type transistor P8 to any one of the nodes W1 and W2. The sources of the P-type transistors P9 and P10 are connected to the drain of the P-type transistor P8. The gates of the P-type transistors P9 and P10 are cross-coupled to drains of each other. The drain of the P-type transistor P9 is connected to the node W2. The drain of the P-type transistor P10 is connected to the node W1. The other part of the structure is the same as that of embodiment 1.

Hereinafter, an operation of the level shifter having the above-described structure is described. First, during a stationary state where the potential of the signal at the input terminal IN is at H (VDD) level, the N-type transistor N1 is ON, the N-type transistor N2 is OFF, the P-type transistors P1 and P10 are OFF, and the P-type transistors P2 and P9 are ON. A current flowing from the P-type transistor P8, which is defined according to the OFF leakage current of the N-type transistor N3, is output to the node W2 through the P-type transistor P9.

In this case, according to the same principle as that illustrated in embodiment 1, a current equivalent to the OFF leakage current flowing through the N-type transistor N2, or a current greater than the OFF leakage current flowing through the N-type transistor N2 by an appropriate margin, is supplied to the node W2 through the P-type transistors P8 and P9, so that the potential of the node W2 is fixed to a potential equal to higher voltage supply VDD3. Meanwhile, the node W1 is disconnected from the P-type transistor P8 because the P-type transistor P10 is OFF. Therefore, the current flowing from the drain of the P-type transistor P8 to the N-type transistor N1, which is the output of the current conversion circuit, is interrupted, whereby the node W1 is surely fixed to L (VSS) level.

Even during a stationary state where the potential of the signal at the input terminal IN is at L (VSS) level contrary to the above, the principle of operation is the same, and therefore, the description thereof is herein omitted.

In the above-described structure, the output current of the P-type transistor P8, equivalent to or greater than the OFF leakage current which flows through the N-type transistor N1 or N2 when it is OFF, is only transmitted by the P-type transistors P9 and P10 functioning as the switch circuit to any one of the nodes W1 and W2 which is at H (VDD3) level, while the output current is not supplied to the other of the nodes W1 and W2 which is at L (VSS) level. Thus, power consumption is further reduced.

Although the above example of embodiment 2 has been described in connection with the level shifter of FIG. 1, the concept of embodiment 2 may be applied to the level shifters of FIG. 2 and FIG. 3, and the same effects are achieved in such cases.

EMBODIMENT 3

Figure 6:
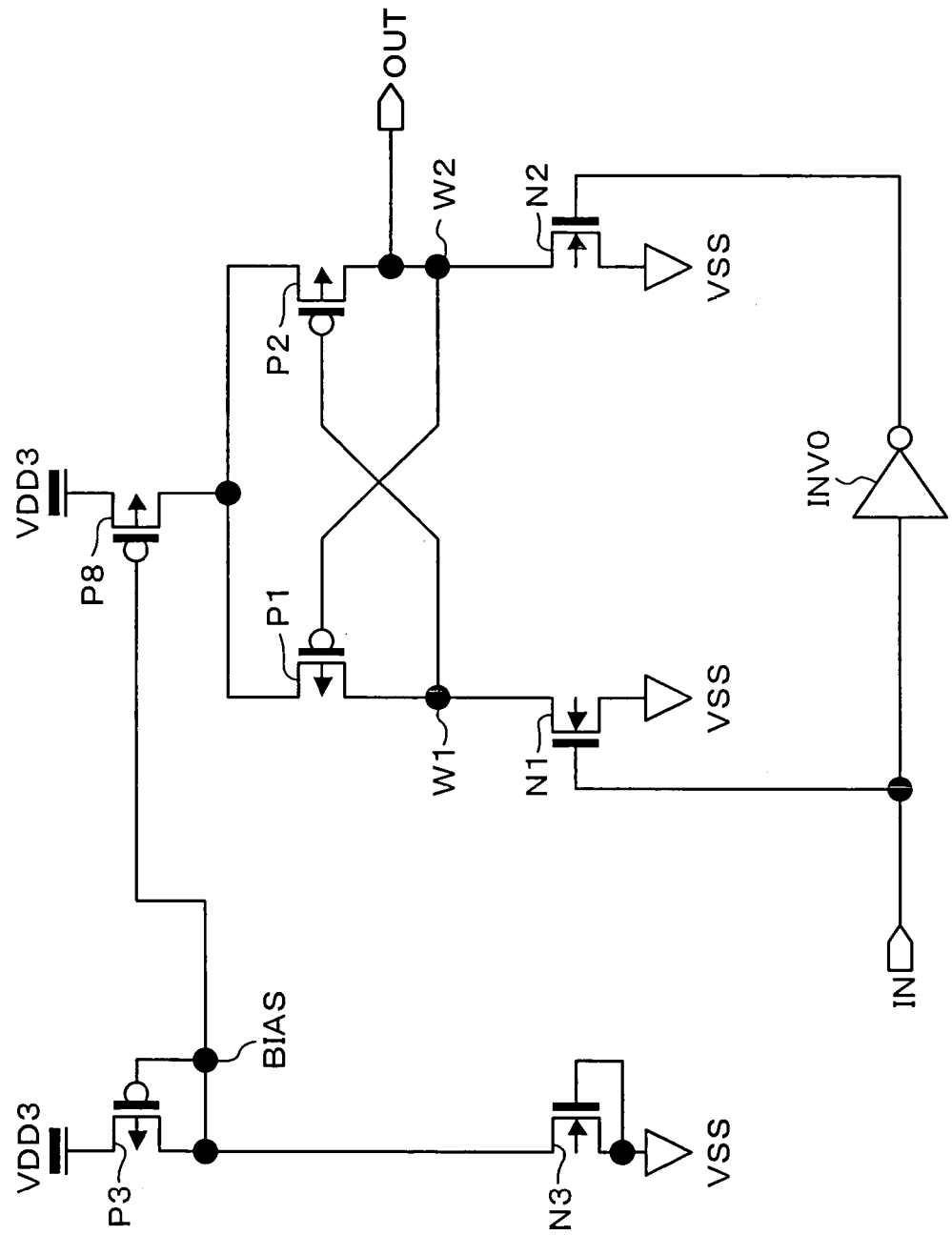
FIG. 6 shows a structure of a level shifter according to embodiment 3 of the present invention.

FIG. 6 shows a specific structure of a level shifter of embodiment 3.

The level shifter of FIG. 6 is different from the level shifter of FIG. 5 of embodiment 2 in that the P-type transistor P10 is merged into the P-type transistor P1 and the P-type transistor P9 is merged into the P-type transistor P2. The drain of the P-type transistor P8 is connected to the sources of the P-type transistors P1 and P2. The P-type transistors P9 and P10 of FIG. 5 are not shown because they are merged into the P-type transistors P2 and P1, respectively. The other part of the structure is the same as that of embodiment 2.

The operation of the level shifter of embodiment 3 is the same as that of the level shifter of FIG. 5 of embodiment 2. The level shifter of embodiment 3 is formed by a smaller number of transistors than the level shifter of embodiment 2, and therefore, the same operation of the level shifter is realized with a smaller circuit area as compared with embodiment 2.

EMBODIMENT 4

Figure 7:
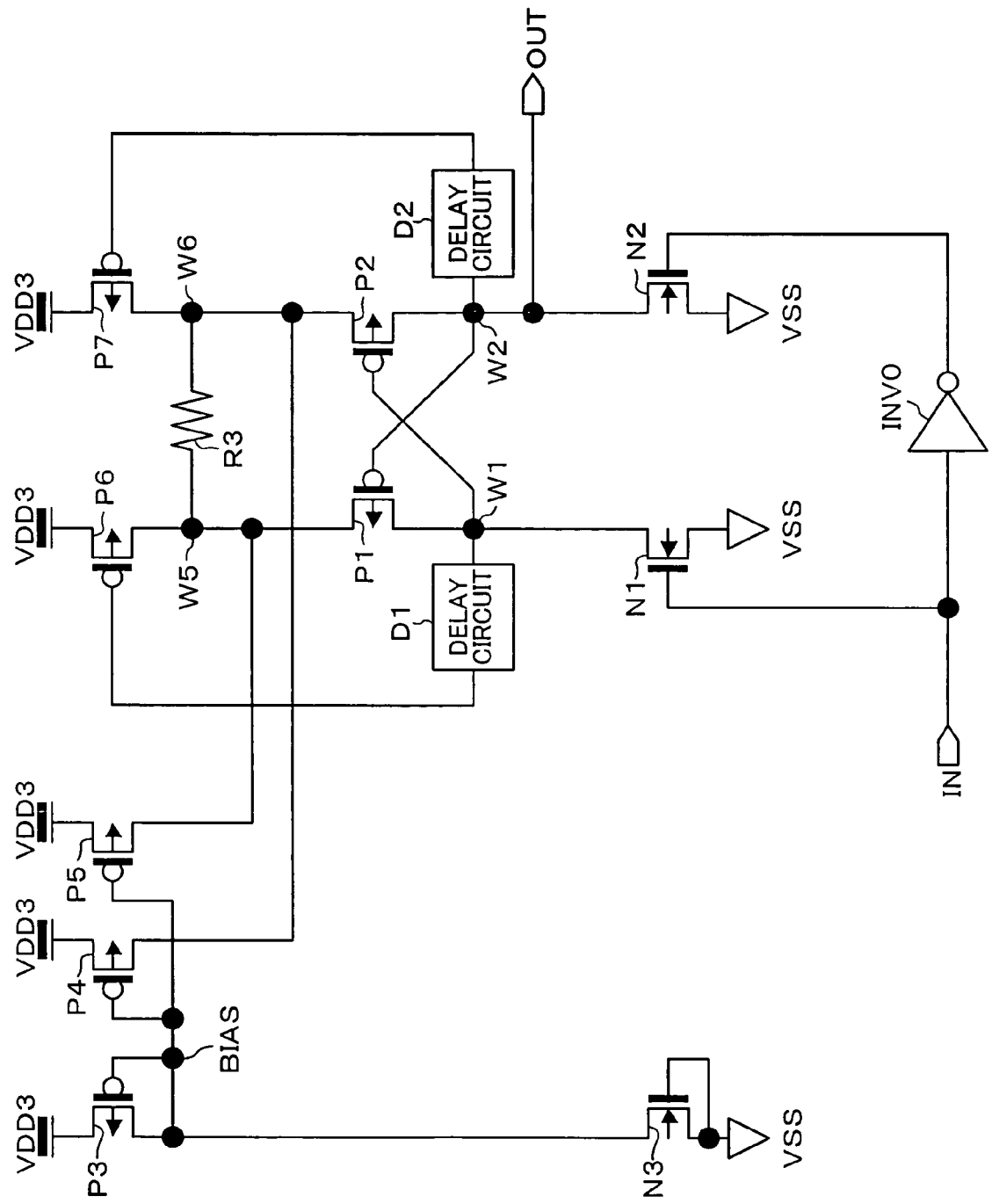
FIG. 7 shows a structure of a level shifter according to embodiment 4 of the present invention.

FIG. 7 shows a specific structure of a level shifter of embodiment 4.

The level shifter of FIG. 7 is different from the level shifter of the second variation of embodiment 1 shown in FIG. 3 in that the drain of the P-type transistor P4 is connected to the node W6, and the drain of the P-type transistor P5 is connected to the node W5. The other part of the structure is the same as that of the second variation of embodiment 1.

According to embodiment 4, as in the second variation of embodiment 1, during a stationary state where the potential of the signal at the input terminal IN is at H (VDD) level, a current equivalent to the OFF leakage current flowing through the drain of the N-type transistor N2, or a current greater than the OFF leakage current flowing through the drain of the N-type transistor N2 by an appropriate margin, is supplied to the node W2 through the P-type transistors P2 and P4, so that the potential of the node W2 is fixed to a potential equal to higher voltage supply VDD3. Meanwhile, the node W1 is disconnected from the P-type transistor P5 because the P-type transistor P1 is OFF. Therefore, the current flowing from the drain of the P-type transistor P5 to the N-type transistor N1, which is the output of the current conversion circuit, is interrupted, whereby the node W1 is surely fixed to L (VSS) level.

Even during a stationary state where the signal at the input terminal IN is at L (VSS) level contrary to the above, the principle of operation is the same, and therefore, the description thereof is herein omitted.

In the above-described structure, the output current of the P-type transistor P4 or P5, equivalent to or greater than the OFF leakage current which flows through the N-type transistor N1 or N2 when it is OFF, is only transmitted by the P-type transistors P1 and P2, functioning as both the switch circuit for providing the output to any one of the nodes W1 and W2 and the power supply circuit, to any one of the nodes W1 and W2 which is at H (VDD3) level, while the output is not supplied to the other of the nodes W1 and W2 which is at L (VSS) level. Thus, power consumption is further reduced. It should be noted that the resistor R3 is omittable so long as the nodes W5 and W6 are supplied with appropriate currents from the P-type transistors P4 and P5, respectively, i.e., so long as the nodes W5 and W6 are pulled up.

EMBODIMENT 5

Figure 8:
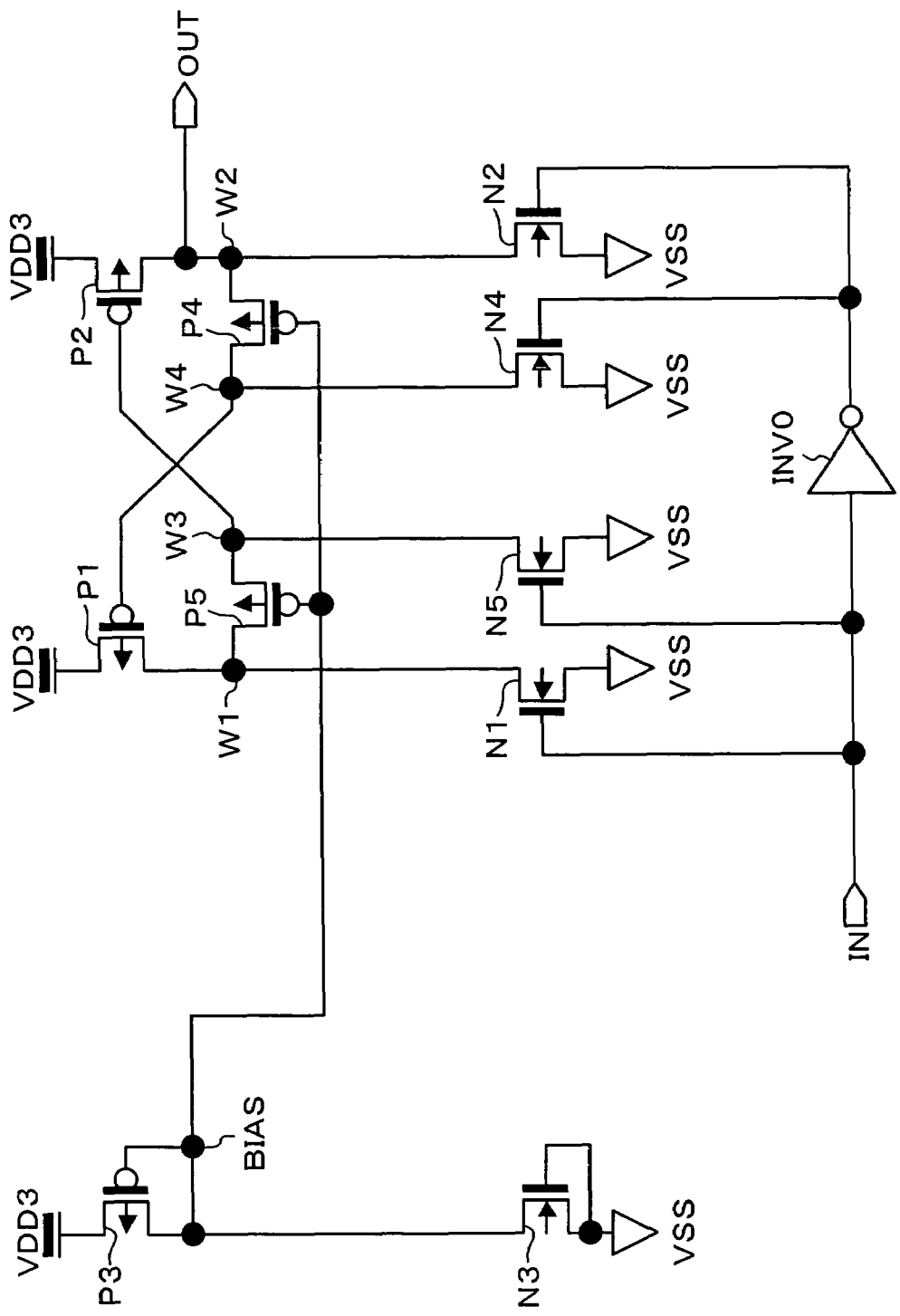
FIG. 8 shows a structure of a level shifter according to embodiment 5 of the present invention.

FIG. 8 shows a specific structure of a level shifter of embodiment 5.

The level shifter of FIG. 8 is different from the level shifter of the first variation of embodiment 1 shown in FIG. 2 in that the resistor R1 is replaced by the P-type transistor P5 whose source and drain are connected to the nodes W1 and W3, respectively, and the resistor R2 is replaced by the P-type transistor P4 whose source and drain are connected to the nodes W2 and W4, respectively. The other part of the structure is the same as that of the first variation of embodiment 1.

According to embodiment 5, during a stationary state where the potential of the signal at the input terminal IN is at H (VDD) level, the node W2 is at H (VDD3) level equal in potential to higher voltage supply VDD3 in the state previously described in the second variation of embodiment 1, and therefore, the P-type transistors P3 and P4 function as a current mirror. Thus, a current equivalent to the OFF leakage current flowing through the drain of the N-type transistor N4, or a current greater than the OFF leakage current flowing through the drain of the N-type transistor N4 by an appropriate margin, is supplied to the node W4 through the P-type transistors P2 and P4, so that the potential of the node W4 is fixed to a potential equal to higher voltage supply VDD3. Meanwhile, the P-type transistor P5 is disconnected from higher voltage supply VDD3 because the P-type transistor P1 is OFF. Therefore, the current flowing from the P-type transistor P5 to the drain of the N-type transistor N3 is interrupted, whereby the node W3 is surely fixed to L (VSS) level.

Even during a stationary state where the signal at the input terminal IN is at L (VSS) level contrary to the above, the principle of operation is the same, and therefore, the description thereof is herein omitted.

In the above-described structure, the output current of the P-type transistor P4 or P5, equivalent to or greater than the OFF leakage current which flows through the N-type transistor N5 or N4 when it is OFF, is only transmitted by the P-type transistors P1 and P2, functioning as both the switch circuit and the power supply circuit, to any one of the nodes W3 and W4 which is at H (VDD3) level, while the output is not supplied to the other of the nodes W3 and W4 which is at L (VSS) level. Thus, power consumption is further reduced.

EMBODIMENT 6

Figure 9:
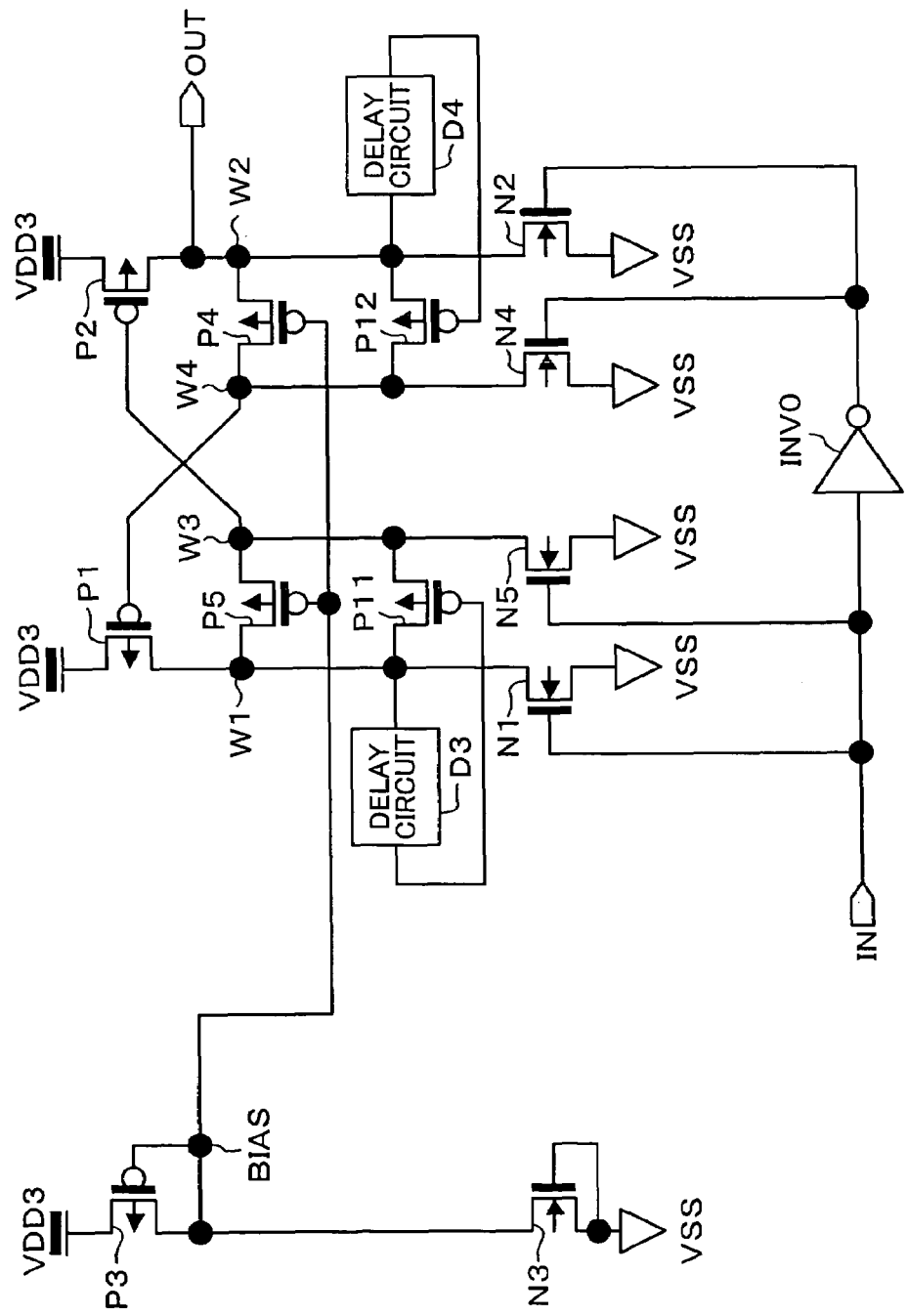
FIG. 9 shows a structure of a level shifter according to embodiment 6 of the present invention.

FIG. 9 shows a specific structure of a level shifter of embodiment 6.

The level shifter of FIG. 9 includes, in addition to the components of the level shifter of FIG. 8 of embodiment 5, an element for connecting the node W3 or W4 to the higher voltage supply for a predetermined time period. Specifically, the level shifter of FIG. 9 includes P-type transistors P11 and P12. The source of the P-type transistor P11 is connected to the node W1. The drain of the P-type transistor P11 is connected to the node W3. The source of the P-type transistor P12 is connected to the node W2. The drain of the P-type transistor P12 is connected to the node W4. The gate of the P-type transistor P11 is connected to the node W1 through a delay circuit D3. The gate of the P-type transistor P12 is connected to the node W2 through a delay circuit D4. The other part of the structure is the same as that of embodiment 5.

According to embodiment 6, during a stationary state where the potential of the signal at the input terminal IN is at H (VDD) level, the P-type transistor P11 is ON, and the P-type transistor P12 is OFF in the state previously described in embodiment 5. Since the node W2 is at H (VDD3) level which is equal in potential to higher voltage supply VDD3, the P-type transistors P3 and P4 function as a current mirror such that a current equivalent to the OFF leakage current flowing through the drain of the N-type transistor N4, or a current greater than the OFF leakage current flowing through the drain of the N-type transistor N4 by an appropriate margin, is supplied to the node W4 through the P-type transistors P2 and P4. As a result, the potential of the node W4 is fixed to a potential equal to higher voltage supply VDD3. Meanwhile, the P-type transistor P5 is disconnected from higher voltage supply VDD3 because the P-type transistor P1 is OFF. Therefore, the current flowing from the P-type transistor P5 to the drain of the N-type transistor N5 is interrupted, whereby the node W3 is surely fixed to L (VSS) level.

At the time of a state transition where the signal at the input terminal IN transitions from H (VDD) level to L (VSS) level, the N-type transistors N1 and N3 are OFF, and the N-type transistors N2 and N4 are ON. Meanwhile, the P-type transistor P12 is kept OFF for the predetermined time period by the delay circuit D4, and the P-type transistor P4 has high resistance to supply a very small current equivalent to or greater than the OFF leakage current generated when the N-type transistor N4 is OFF. Thus, the potential of the node W4 sharply decreases from H (VDD3) level to L (VSS) level. Thereafter, the P-type transistor P4 is turned ON so that the potential of the node W4 increases from L (VSS) level to H (VDD3) level. At this point in time, the P-type transistor P11 is kept ON for the predetermined time period by the delay circuit D3. Thus, the potential of the node W3 increases from L (VSS) level to H (VDD3) level. As a result, when the P-type transistor P2 is turned OFF, the potential of the node W2 decreases from H (VDD3) level to L (VSS) level. Finally, the P-type transistor P11 is turned OFF while the P-type transistor P12 is turned ON, and the operation enters a stationary state to wait for a next change in the input signal.

Even during a stationary state where the signal at the input terminal IN is at L (VSS) level and a state transition where the signal at the input terminal IN transitions from L (VSS) level to H (VDD) level contrary to the above, the principle of operation is the same, and therefore, the description thereof is herein omitted.

Thus, the increase in potential from L (VSS) level to H (VDD) level at the nodes W3 and W4 is achieved more quickly because the nodes W1 and W3 and the nodes W2 and W4 are connected by the P-type transistor P11 and the P-type transistor P12, respectively, even when the P-type transistors P4 and P5 have high resistance. The delay times of the delay circuits D3 and D4 are desirably set equal to or greater than a time period when the potential of each of the nodes W3 and W4 increases from L (VSS) level to H (VDD3) level.

EMBODIMENT 7

Figure 10:
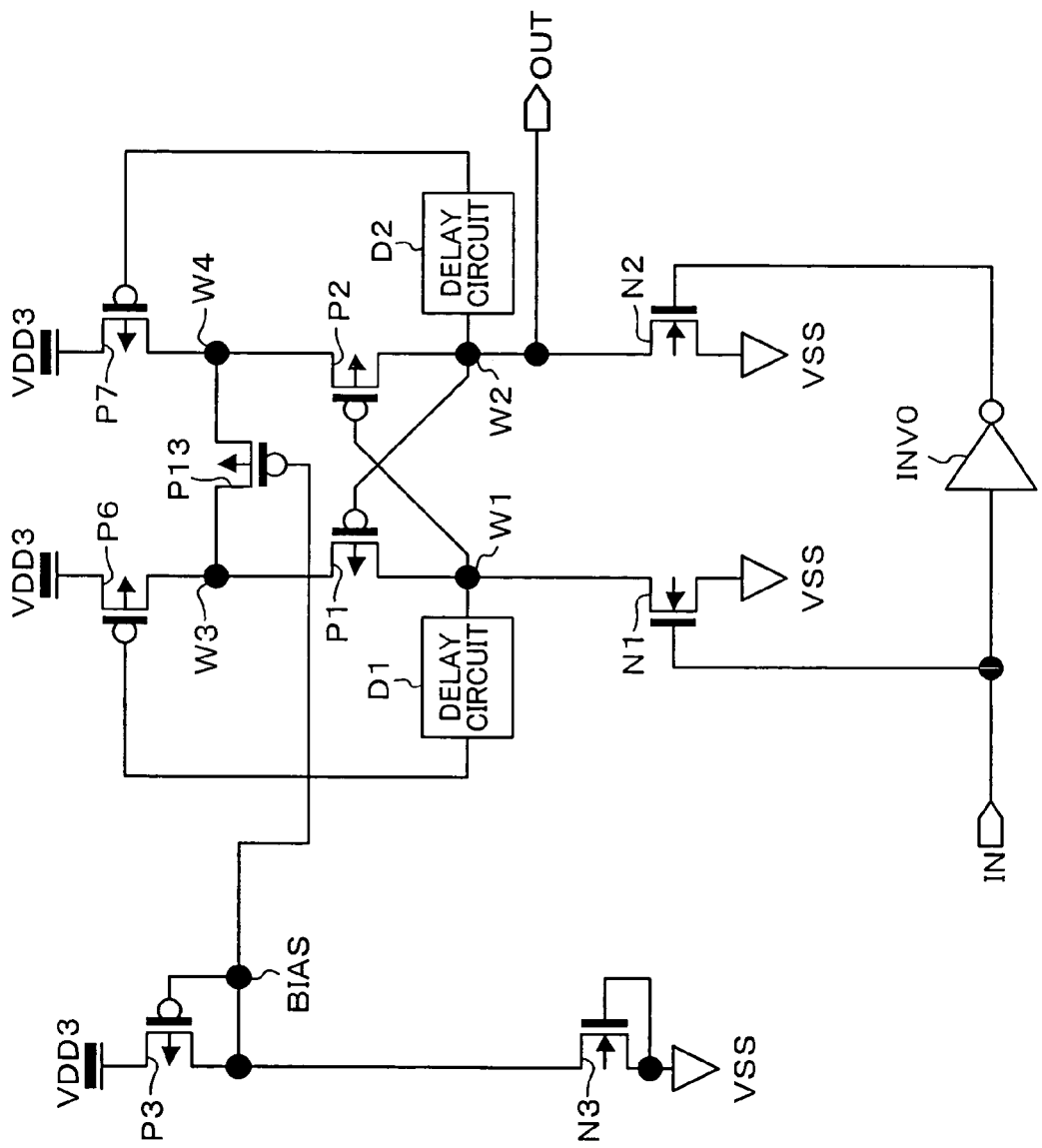
FIG. 10 shows a structure of a level shifter according to embodiment 7 of the present invention.

FIG. 10 shows a specific structure of a level shifter of embodiment 7.

The level shifter of FIG. 9 is different from the level shifter of FIG. 7 of embodiment 4 in that the resistor R3 and the P-type transistors P4 and P5 of FIG. 7 are merged into one element. Specifically, the level shifter of FIG. 9 includes a P-type transistor P13 in place of the resistor R3 and the P-type transistors P4 and P5 of FIG. 7. The source and drain of the P-type transistor P13 are connected to the node W3 and the node W4, respectively. The other part of the structure is the same as that of embodiment 4.

Embodiment 7 is different from embodiment 4 in that, during a stationary state where the potential of the signal at the input terminal IN is at H (VDD) level, the node W2 has already been pulled up to higher voltage supply VDD3 through the P-type transistors P2, P13 and P6 in the state previously described in embodiment 4. The node W3 is connected to higher voltage supply VDD3 because the P-type transistor P6 is ON, but is disconnected from the node W1 because the P-type transistor P1 is OFF. Accordingly, the potential of the node W3 is at H (VDD3) level which is equal in potential to higher voltage supply VDD3, and the P-type transistors P3 and P13 function as a current mirror such that a current equivalent to the OFF leakage current flowing through the drain of the N-type transistor N2, or a current greater than the OFF leakage current flowing through the drain of the N-type transistor N2 by an appropriate margin, is supplied to the node W2 through the P-type transistors P2, P13 and P6. As a result, the potential of the node W2 is fixed to a potential equal to higher voltage supply VDD3. Meanwhile, the drain of the N-type transistor N1 is disconnected from higher voltage supply VDD3 because the P-type transistor P1 is OFF, so that no element supplies the node W1 with an OFF leakage current from the high voltage source as is supplied to the node W2. As a result, no unnecessary current flows, and the node W1 is surely fixed to L (VSS) level.

Even during a stationary state where the potential of the signal at the input terminal IN is at L (VSS) level contrary to the above, the principle of operation is the same, and therefore, the description thereof is herein omitted. At the state transitions where the signal at the input terminal IN transitions from L (VSS) level to H (VDD) level and where the signal at the input terminal IN transitions from H (VDD) level to L (VSS) level, the operations in these cases are not the essential part of the present invention, and therefore, the descriptions thereof are herein omitted.

In the above-described structure, the output current of the P-type transistor P13, equivalent to or greater than the OFF leakage current which flows through the N-type transistor N1 or N2 when it is OFF, is only transmitted by the P-type transistors P1 and P2, functioning as both the switch circuit and the power supply circuit, to any one of the nodes W1 and W2 which is at H (VDD3) level, while the output is not supplied to the other of the nodes W1 and W2 which is at L (VSS) level. Thus, power consumption is further reduced. Further, the level shifter of embodiment 7 is formed by a smaller number of transistors than the level shifter shown in FIG. 7, and therefore, the circuit area is further reduced.

EMBODIMENT 8

Figure 11:
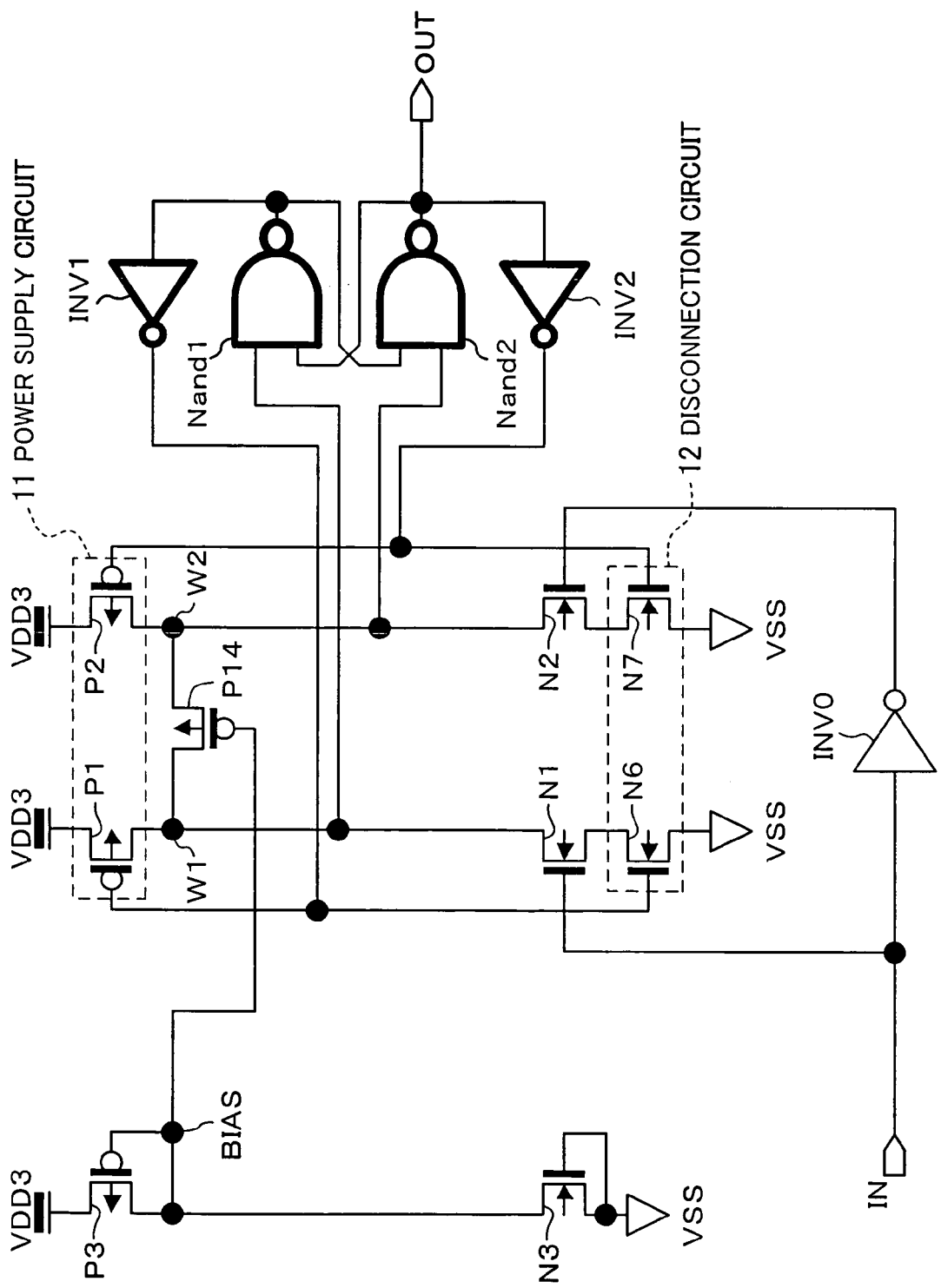
FIG. 11 shows a structure of a level shifter according to embodiment 8 of the present invention.

FIG. 11 shows a specific structure of a level shifter of embodiment 8.

The level shifter of FIG. 11 is different from the level shifter of FIG. 4 of the third variation of embodiment 1 in that the resistor R4 and the P-type transistors P4 and P5 of FIG. 4 are merged into one element. Specifically, the level shifter of FIG. 11 includes a P-type transistor P14 in place of the resistor R4 and the P-type transistors P4 and P5 of FIG. 4. The source and drain of the P-type transistor P14 are connected to the node W1 and the node W2, respectively. The other part of the structure is the same as that of the third variation of embodiment 1.

Embodiment 8 is different from the third variation of embodiment 1 in that, during a stationary state where the potential of the signal at the input terminal IN is at H (VDD) level, the node W2 has already been pulled up to higher voltage supply VDD3 through the P-type transistors P14 and P1 in the state previously described in the third variation of embodiment 1. The node W1 is connected to higher voltage supply VDD3 because the P-type transistor P1 is ON, but is disconnected from the ground because the N-type transistor N6 is OFF. Accordingly, the potential of the node W1 is at H (VDD3) level which is equal in potential to higher voltage supply VDD3, and the P-type transistors P3 and P14 function as a current mirror such that a current equivalent to the OFF leakage current flowing through the drain of the N-type transistor N2, or a current greater than the OFF leakage current flowing through the drain of the N-type transistor N2 by an appropriate margin, is supplied to the node W2 through the P-type transistors P14 and P1. As a result, the potential of the node W2 is fixed to a potential substantially equal to higher voltage supply VDD3.

Even during a stationary state where the potential of the signal at the input terminal IN is at L (VSS) level contrary to the above, the principle of operation is the same, and therefore, the description thereof is herein omitted. At the state transitions where the signal at the input terminal IN transitions from L (VSS) level to H (VDD) level and where the signal at the input terminal IN transitions from H (VDD) level to L (VSS) level, the operations in these cases are not the essential part of the present invention, and therefore, the descriptions thereof are herein omitted.

With the above-described structure, the level shifter of embodiment 8 is formed by a smaller number of transistors than the level shifter shown in FIG. 3, and therefore, the circuit area is further reduced.

EMBODIMENT 9

Figure 12:
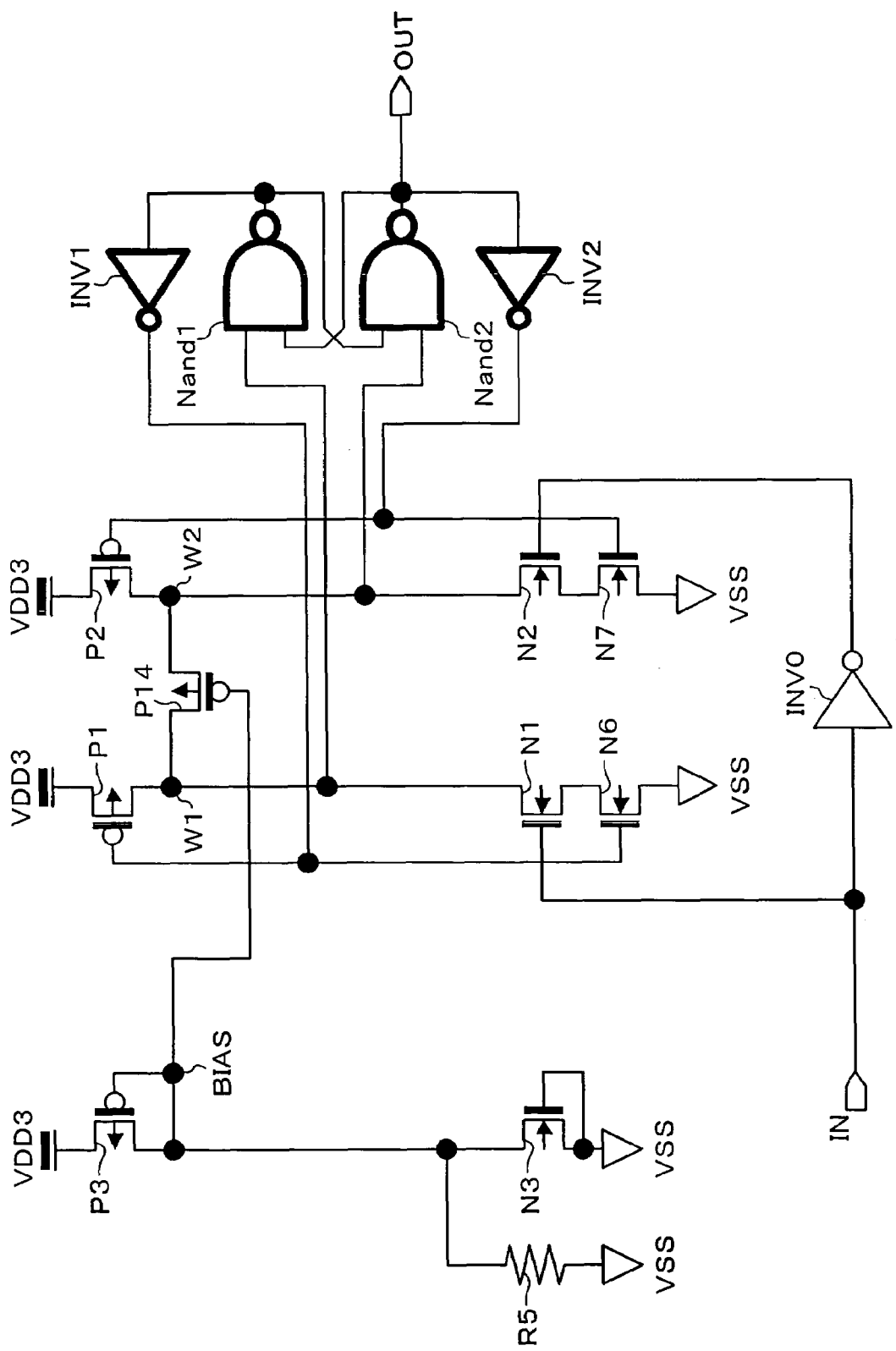
FIG. 12 shows a structure of a level shifter according to embodiment 9 of the present invention.

FIG. 12 shows a specific structure of a level shifter of embodiment 9.

The level shifter of FIG. 12 is different from the level shifter of FIG. 11 of embodiment 8 in that a resistor R5 is provided between the node BIAS and the ground. The other part of the structure is the same as that of embodiment 8.

Embodiment 9 is different from embodiment 8 in that one of the nodes W1 and W2 which is currently pulled up is supplied with the sum of an OFF leakage current generated by the N-type transistor N3 (OFF leakage generation circuit) and a current flowing through the resistor R5. Therefore, in the structure of FIG. 12, a current which is defined according to the current flowing through the resistor R5 is additionally supplied to the current flowing through one of the nodes W1 and W2 which is currently pulled up, whereby the node W1 or W2 is prevented from floating, and a malfunction of the level shifter is avoided; although in the structure of FIG. 11 which does not have the resistor R5, if the threshold voltage of the N-type transistor N3 is increased due to a variation in temperature or production process so that the OFF leakage current of the N-type transistor N3 becomes very small, one of the nodes W1 and W2 which is currently pulled up would be further pulled up by the very small current (resulting in a near-floating state) in some cases, whereby the node would be decreased from H (VDD3) level due to external noise, or the like, and a malfunction of the level shifter would be caused. Desirably, the resistor R5 has high resistance such that the level shifter is operable even when lower voltage supply VDD is a low voltage, or has a resistance value such that the node W1 or W2 is pulled up to be prevented from floating, and a malfunction of the level shifter is avoided. It should be noted that the resistor R5 may be formed by a transistor which is currently ON.

Figure 17:
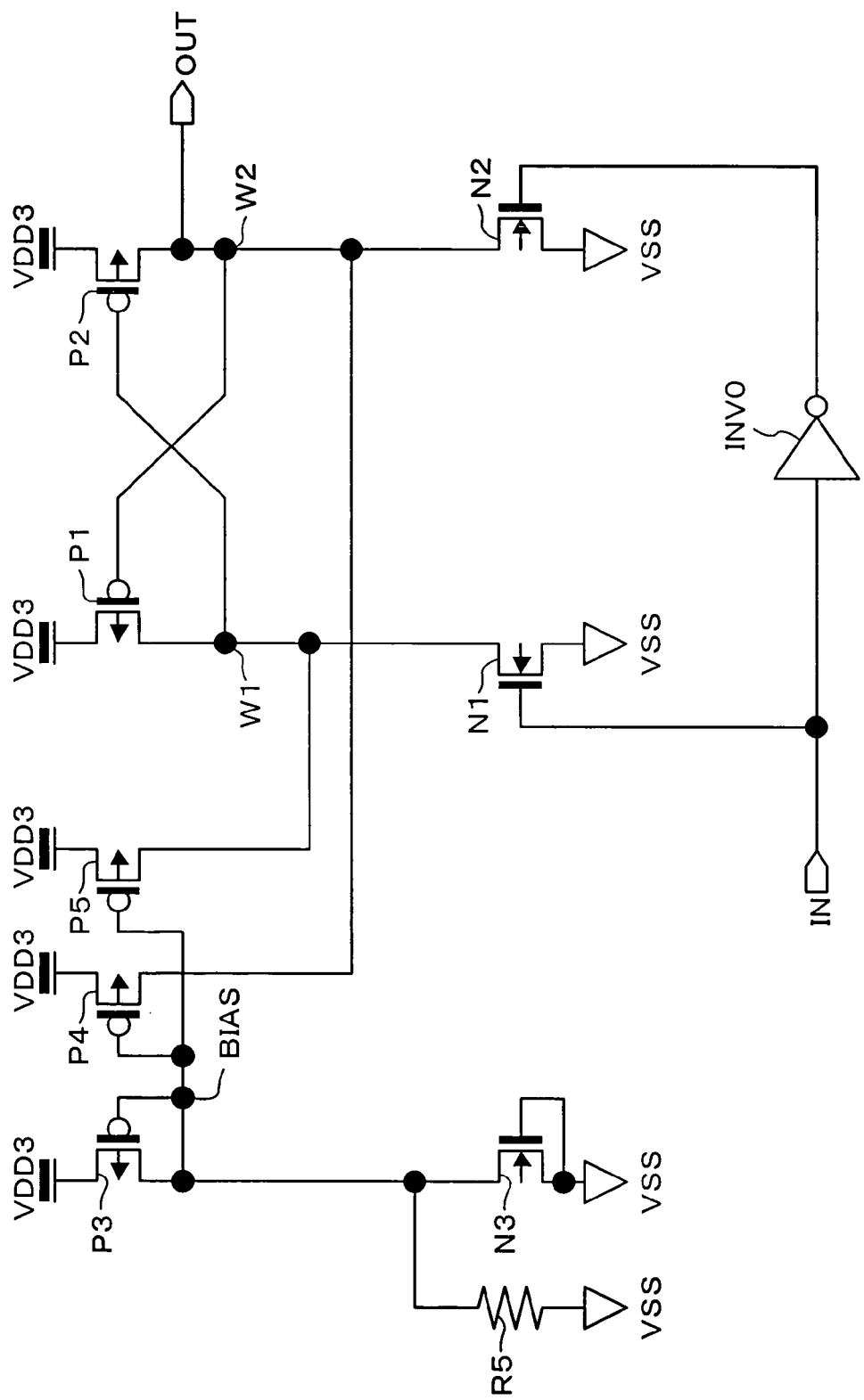
FIG. 17 shows a structure of a first variation of the level shifter of embodiment 9 of the present invention.
Figure 18:
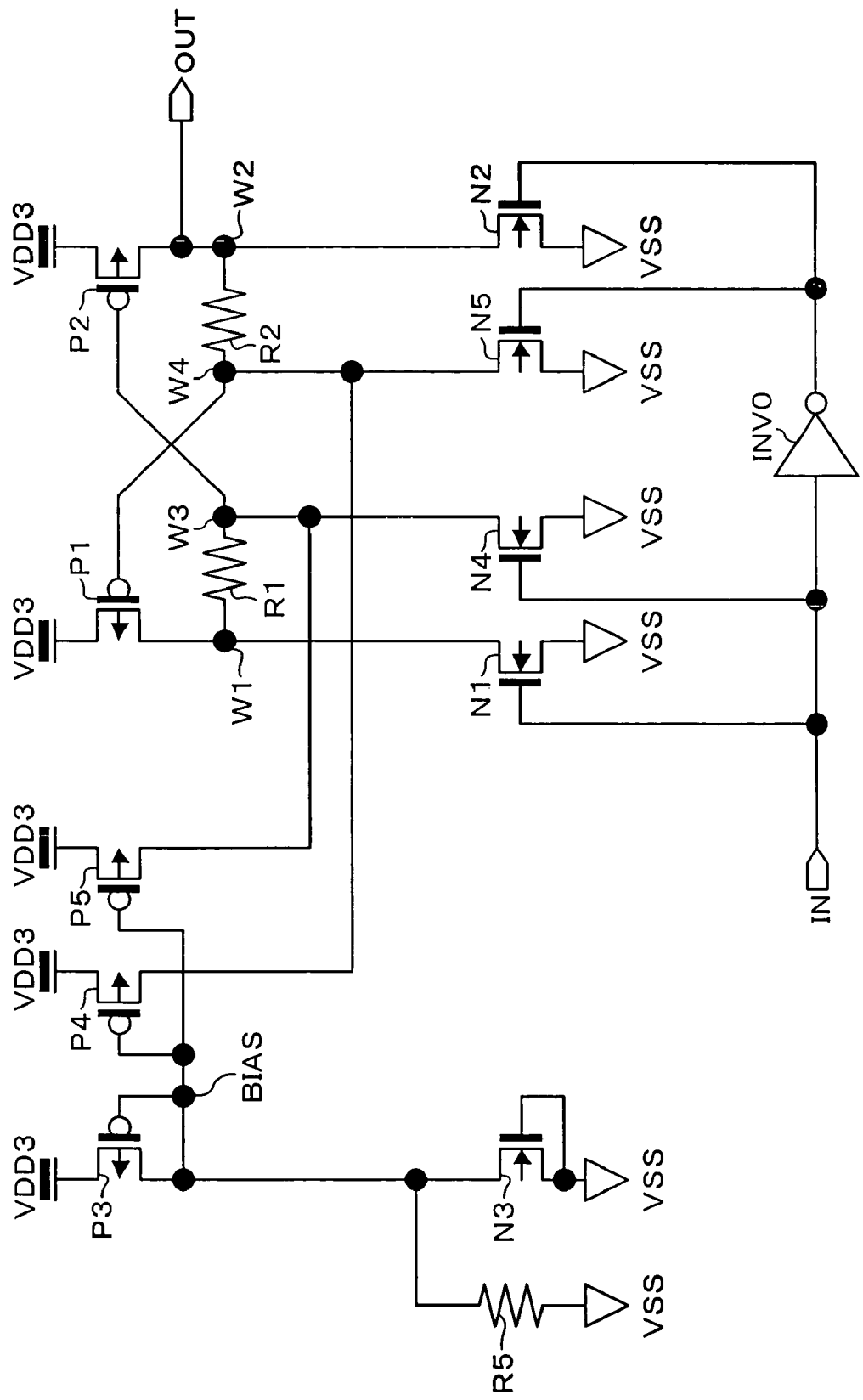
FIG. 18 shows a structure of a second variation of the level shifter of embodiment 9.
Figure 19:
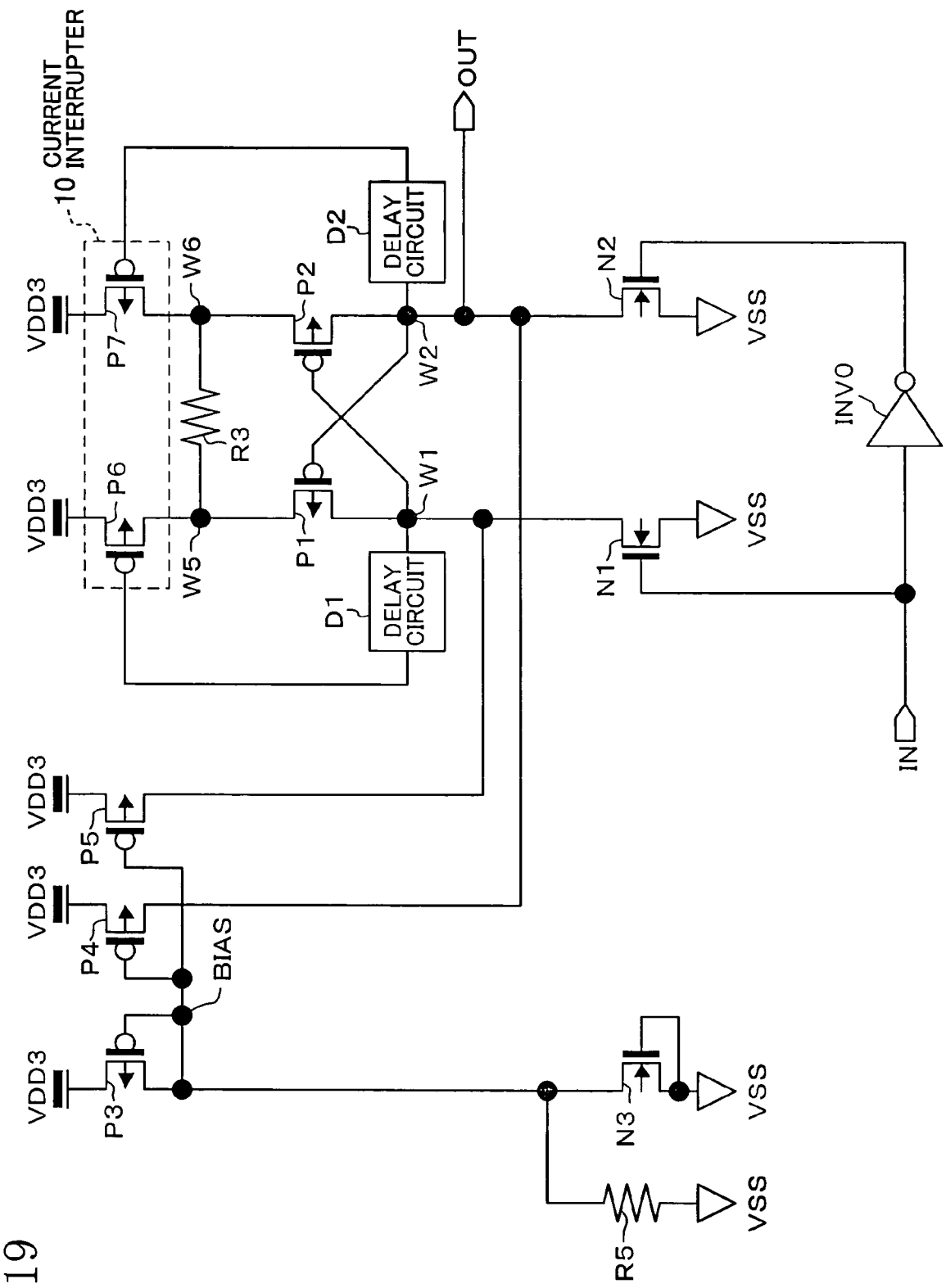
FIG. 19 shows a structure of a third variation of the level shifter of embodiment 9.

Although the above example of embodiment 9 has been described in connection with the level shifter of FIG. 11, the concept of embodiment 9 may be applied to other level shifters, and the same effects are achieved in such cases. For example, applications of the concept of embodiment 9 to the level shifters of FIG. 1, FIG. 2 and FIG. 3, wherein the resistor R5 is added, result in level shifters shown in FIG. 17 (first variation), FIG. 18 (second variation) and FIG. 19 (third variation), respectively.

EMBODIMENT 10

Figure 13:
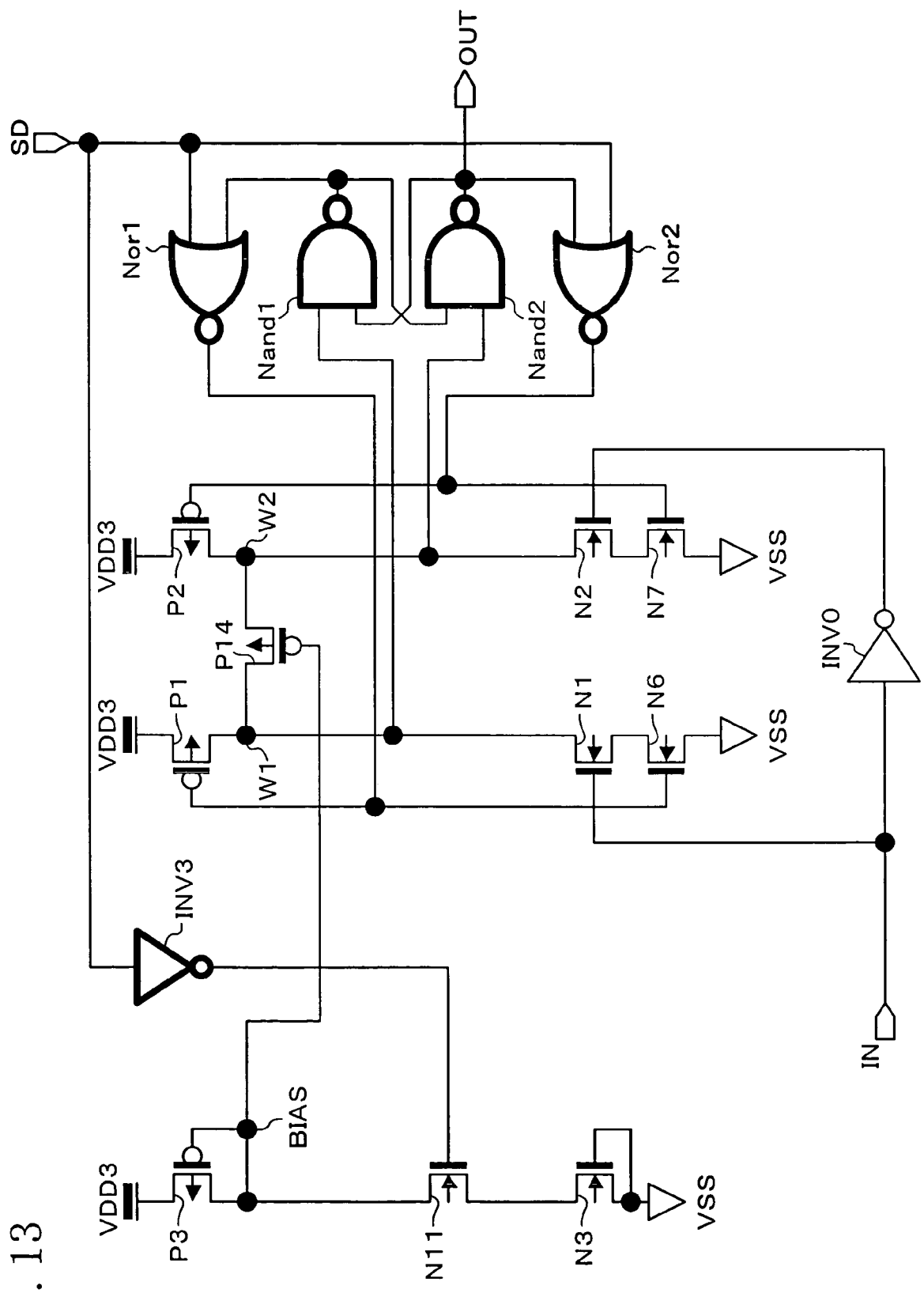
FIG. 13 shows a structure of a level shifter according to embodiment 10 of the present invention.

FIG. 13 shows a specific structure of a level shifter of embodiment 10.

The level shifter of FIG. 13 includes, in addition to the components of the level shifter of FIG. 11 of embodiment 8, a function for stopping the level shift operation when lower voltage supply VDD is shut down and a function for reducing current consumption. Specifically, the level shifter of FIG. 13 includes an N-type transistor N11 between the node BIAS and the N-type transistor N3. The source and drain of the N-type transistor N11 are connected to the drain of the N-type transistor N3 and the node BIAS, respectively. The level shifter of FIG. 13 further includes an input terminal SD for receiving a shut-down signal for lower voltage supply VDD and an inverter circuit INV3.

The inverter circuit INV3 inverts the signal received at the input terminal SD to output the inverted signal to the gate of the N-type transistor (disconnection circuit) N11. Further, the inverter circuits INV1 and INV2 of FIG. 11 are replaced by 2-input NOR circuits Nor1 and Nor2. One of the inputs of each of the NOR circuits Nor1 and Nor2 is connected to the input terminal SD. The other part of the structure is the same as that of embodiment 8.

According to embodiment 10, during a normal operation mode where L (VSS) level is input at the input terminal SD, the inverter circuit INV3 inverts the L (VSS) level signal input at the input terminal SD to output the resultant H (VDD3) level signal to the gate of the N-type transistor N11, so that the node BIAS is connected to the drain of the N-type transistor N3. Meanwhile, the NOR circuits Nor1 and Nor2, to which the input terminal SD at L (VSS) level is connected, has the same function as that of an inverter circuit which inverts the other input signal and, therefore, function in the same way as the circuit shown in FIG. 11. On the other hand, during a shut-down mode where H (VDD3) level is input at the input terminal SD, the inverter circuit INV3 inverts the H (VDD3) level signal input at the input terminal SD to output the resultant L (VSS) level signal to the gate of the N-type transistor N11, so that the node BIAS is disconnected from the drain of the N-type transistor N3. Meanwhile, the outputs of the NOR circuits Nor1 and Nor2, to which the input terminal SD at H (VDD3) level is connected, are both at L (VSS) level. As a result, irrespective of the input logic at the input terminal IN, the P-type transistors P1 and P2 are ON while the N-type transistors N6 and N7 are OFF, so that both the nodes W1 and W2 are at H (VDD3) level, and the output logics of the NAND circuits Nand1 and Nand2 are maintained, whereby the level shift operation is stopped. Therefore, in the shut-down mode, no OFF leakage current flows from the P-type transistor P3 to the N-type transistor N3, and thus, power consumption is further reduced.

Figure 20:
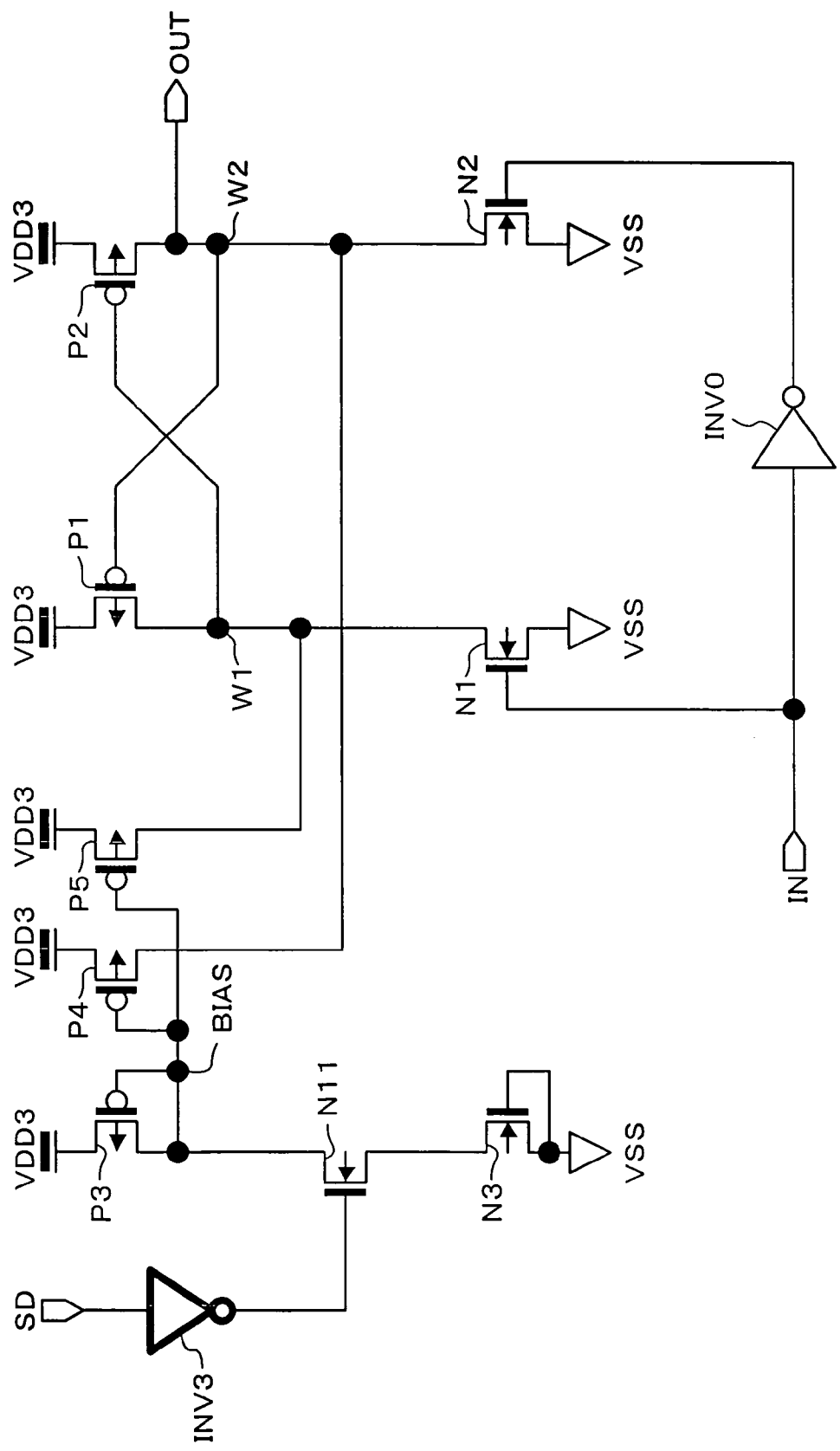
FIG. 20 shows a structure of a first variation of the level shifter of embodiment 10 of the present invention.
Figure 21:
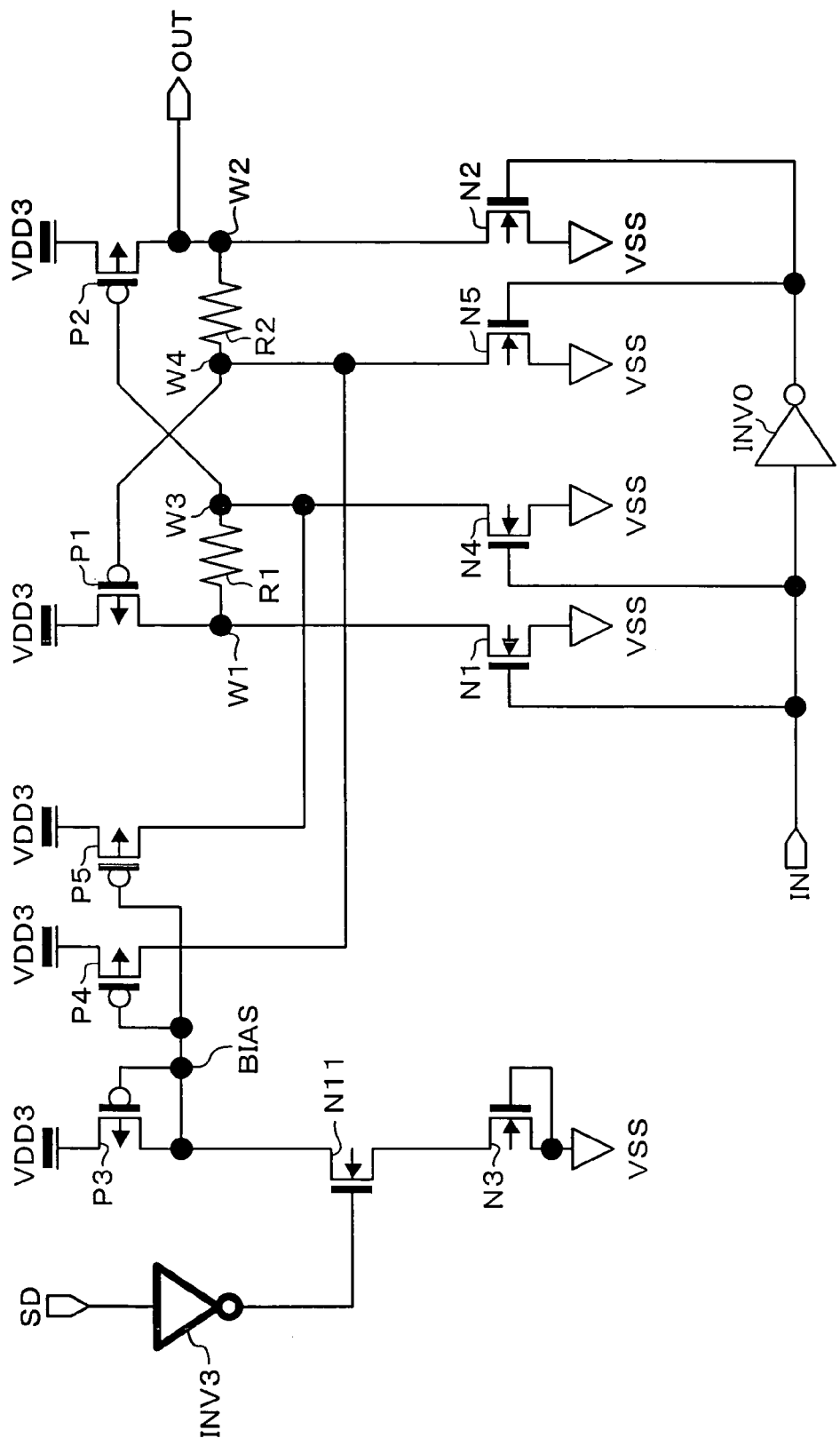
FIG. 21 shows a structure of a second variation of the level shifter of embodiment 10.
Figure 22:
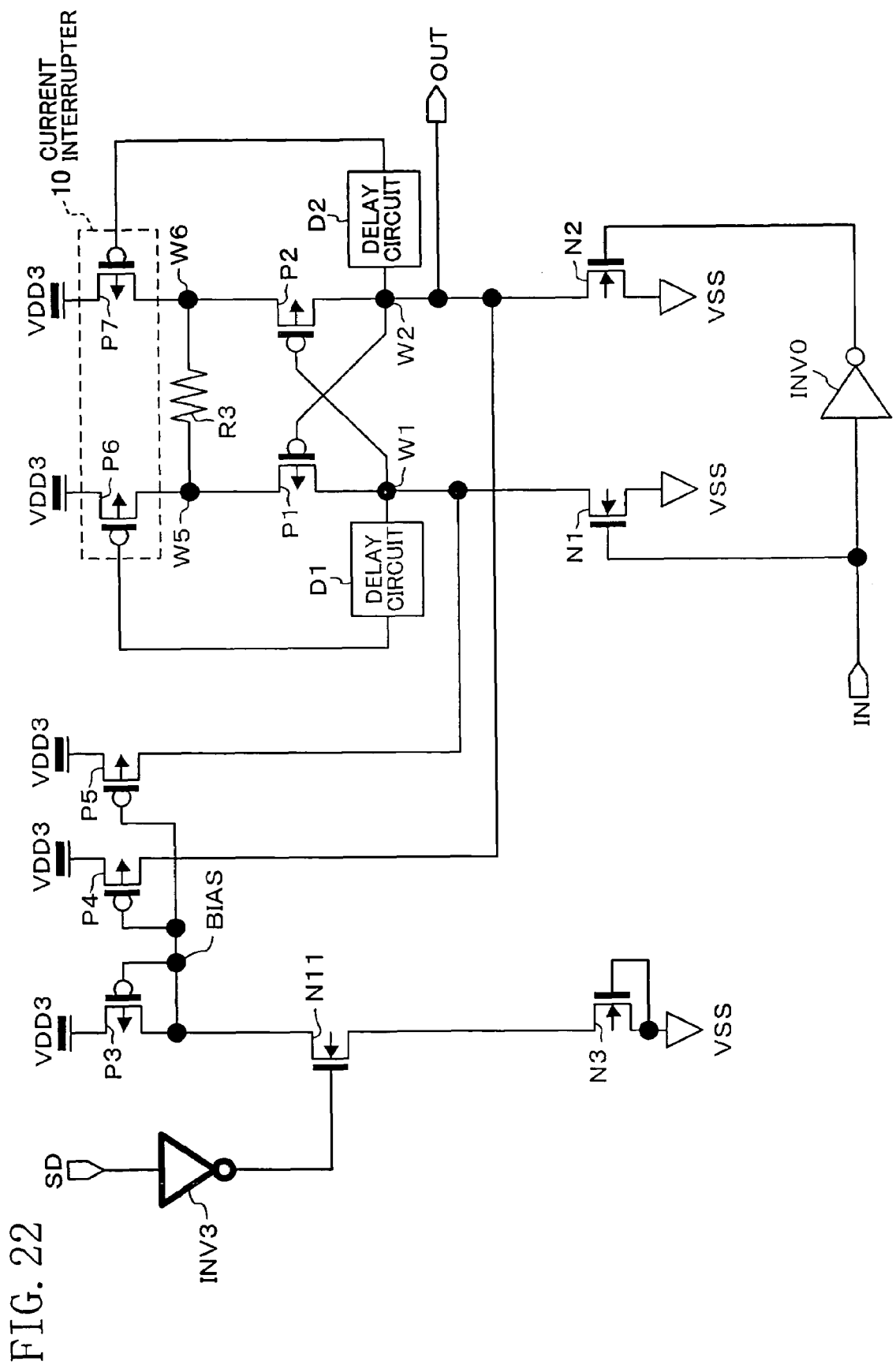
FIG. 22 shows a structure of a third variation of the level shifter of embodiment 10.

Although the above example of embodiment 10 has been described in connection with the level shifter of FIG. 7, the concept of embodiment 10 may be applied to other level shifters. For example, as a matter of course, the concept of embodiment 10 may be applied to the level shifters of FIG. 1, FIG. 2 and FIG. 3, wherein the shut-down circuit and the disconnection circuit (N-type transistor N11) for disconnecting the node BIAS from the N-type transistor N3 are added, resulting in level shifters shown in FIG. 20 (first variation), FIG. 21 (second variation) and FIG. 22 (third variation), respectively.

EMBODIMENT 11

Figure 14:
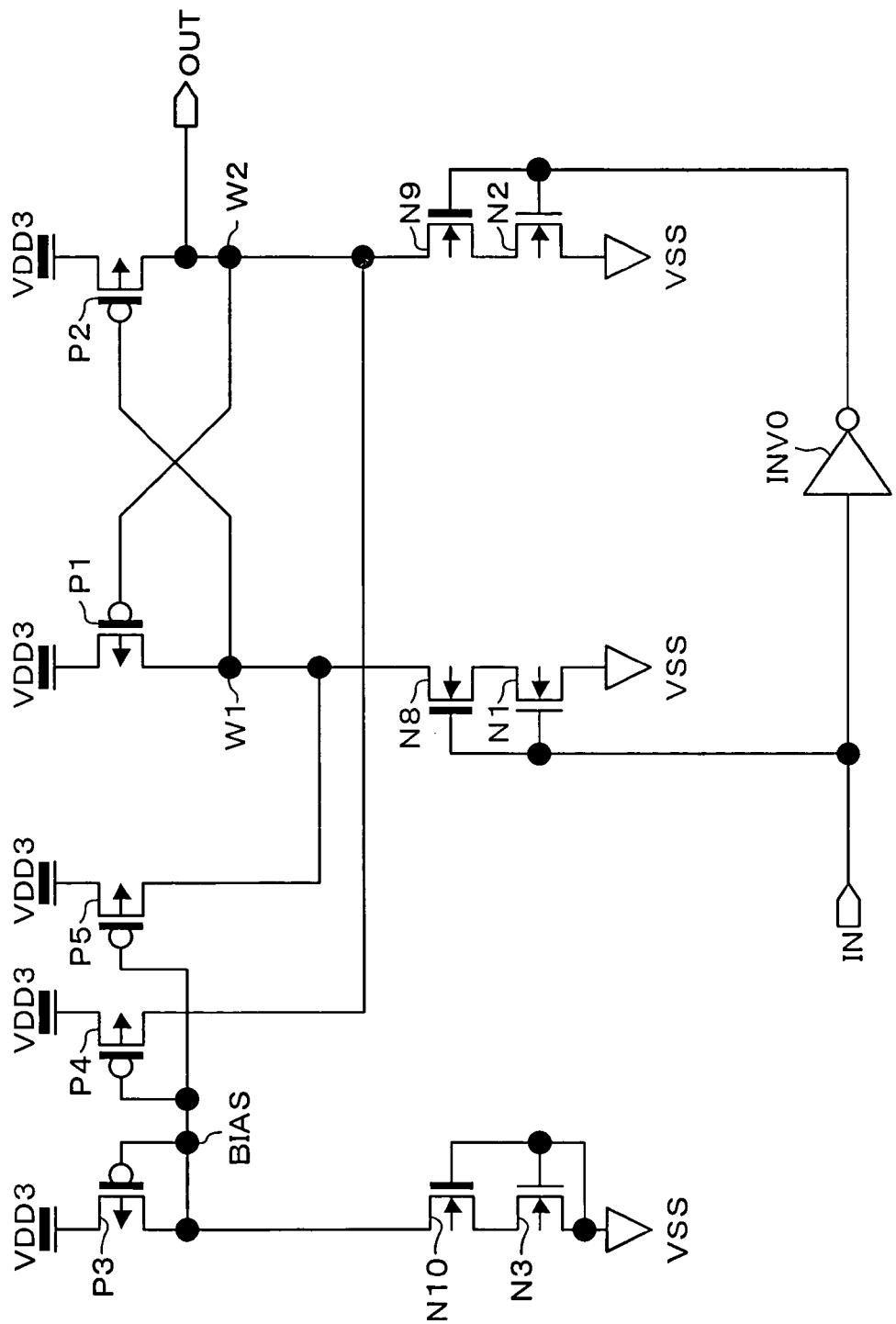
FIG. 14 shows a structure of a level shifter according to embodiment 11 of the present invention.
Figure 15:
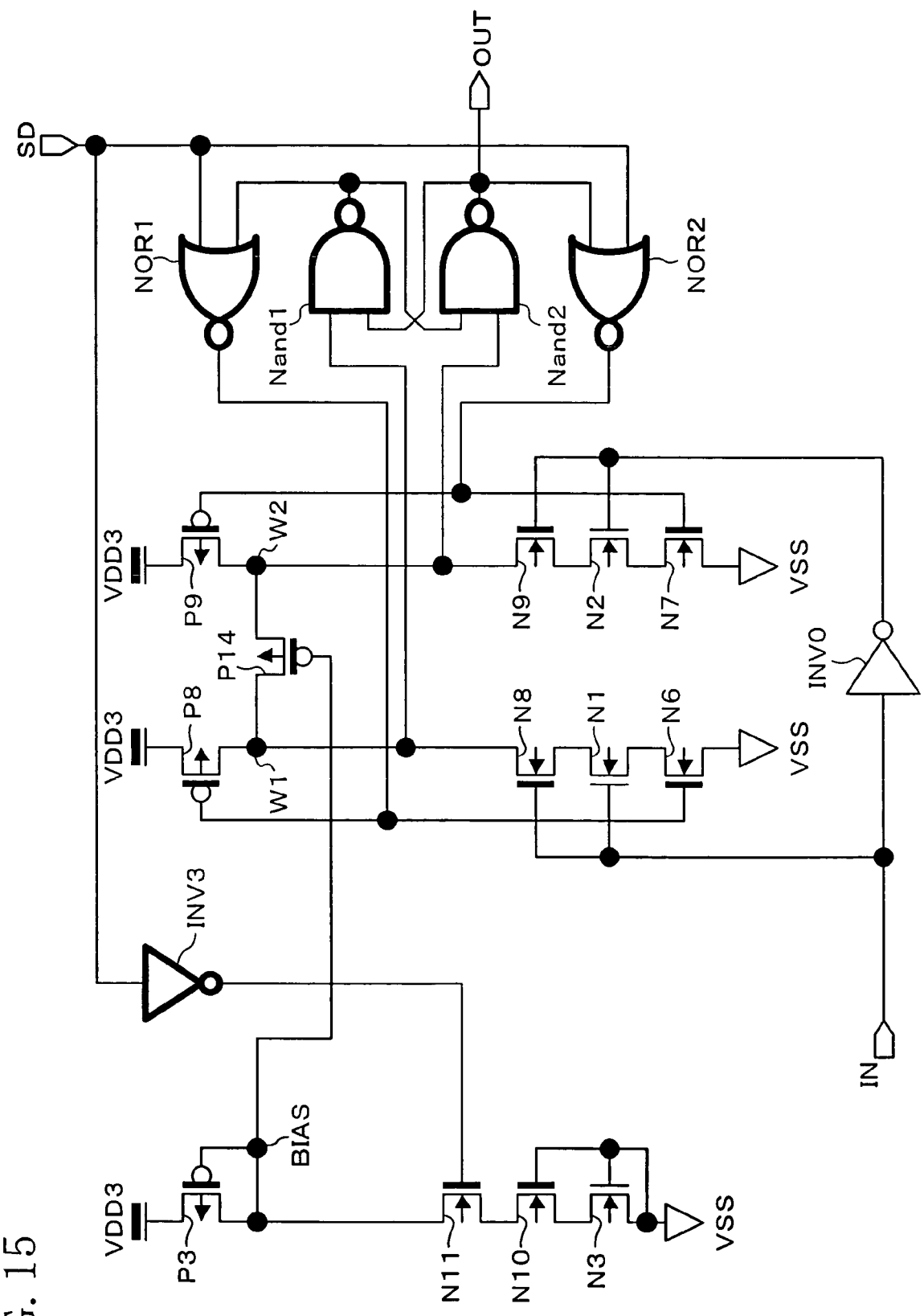
FIG. 15 shows an alternative structure of the level shifter according to embodiment 11 of the present invention.

FIG. 14 and FIG. 15 show specific structures of a level shifter of embodiment 11.

FIG. 14 shows a best mode of embodiment 11 which is different from the level shifter of FIG. 1 of embodiment 1 in that the transistors for signal input and the transistor of the OFF leakage generation circuit are set to have low threshold voltages. Specifically, the level shifter of FIG. 14 further includes N-type transistors N8, N9 and N10 which are formed by higher voltage side transistors (first to third first-conductivity type high-voltage transistors). The N-type transistors N8, N9 and N1O are set to have a threshold voltage substantially equal to 0 V. The N-type transistors N1, N2 and N3 are formed by lower voltage side transistors (first-conductivity type low-voltage transistors). The N-type transistor N8 (first first-conductivity type high-voltage transistor) is provided between the N-type transistor N1 and the node W1. The N-type transistor N9 (second first-conductivity type high-voltage transistor) is provided between the N-type transistor N2 and the node W2. The N-type transistor N10 (third first-conductivity type high-voltage transistor) is provided between the N-type transistor N3 and the node BIAS.

The gates of the N-type transistors N8, N9 and N10 are connected to the gates of the N-type transistors N1, N2 and N3, respectively. The N-type transistors N1, N2 and N3 are set to have a low threshold voltage such that the level shifter is operable even when lower voltage supply VDD is a low voltage. For example, the threshold of the N-type transistors N1, N2 and N3 is set equal to that of other lower voltage side transistors, for example, some N-type transistors included in the inverter INV0. The other part of the structure is the same as that of embodiment 1 shown in FIG. 1.

FIG. 15 shows another best mode of embodiment 11 which is different from the level shifter of FIG. 13 of embodiment 10 in that the transistors for signal input and the transistor of the OFF leakage generation circuit are set to have low threshold voltages. Specifically, the N-type transistors N1, N2 and N3 are formed by lower voltage side transistors. The N-type transistor N8 is provided between the N-type transistor N1 and the node W1. The N-type transistor N9 is provided between the N-type transistor N2 and the node W2. The N-type transistor N10 is provided between the N-type transistor N3 and the N-type transistor N13. The gates of the N-type transistors N8, N9 and N10 are connected to the gates of the N-type transistors N1, N2 and N3, respectively. The other part of the structure is the same as that of embodiment 10.

According to embodiment 11, during a stationary state where the potential of the signal at the input terminal IN is at H (VDD) level, L (VSS) level is input to the gates of the N-type transistors N2 and N9. In this state, a potential decreased from the potential at the gate of the N-type transistor N9 by the threshold voltage (i.e., substantially 0 V), i.e., substantially 0 V, is applied to the drain of the N-type transistor N2. Since the drain voltage of the N-type transistor N2 at a low level, the OFF leakage current is small, and accordingly, power consumption is further reduced as compared with the circuit structures shown in FIG. 1 and FIG. 13. Meanwhile, the N-type transistors N1, N2, N8 and N9 are all set to have a low threshold voltage and are therefore operable even when lower voltage supply VDD is further lowered.

Even during a stationary state where the potential of the signal at the input terminal IN is at L (VSS) level contrary to the above, the principle of operation is the same, and therefore, the description thereof is herein omitted.

With the above structure, the OFF leakage currents flowing through the N-type transistors N1, N2, and N3 when they are OFF are decreased, and power consumption is further reduced as compared with the level shifters shown in FIG. 1 and FIG. 13. It is for the same reasons as described in embodiment 1 that the N-type transistors N1, N2, and N3 are desirably set to have the same threshold voltage and that the N-type transistors N8, N9, and N10 are desirably set to have the same threshold voltage.

Figure 23:
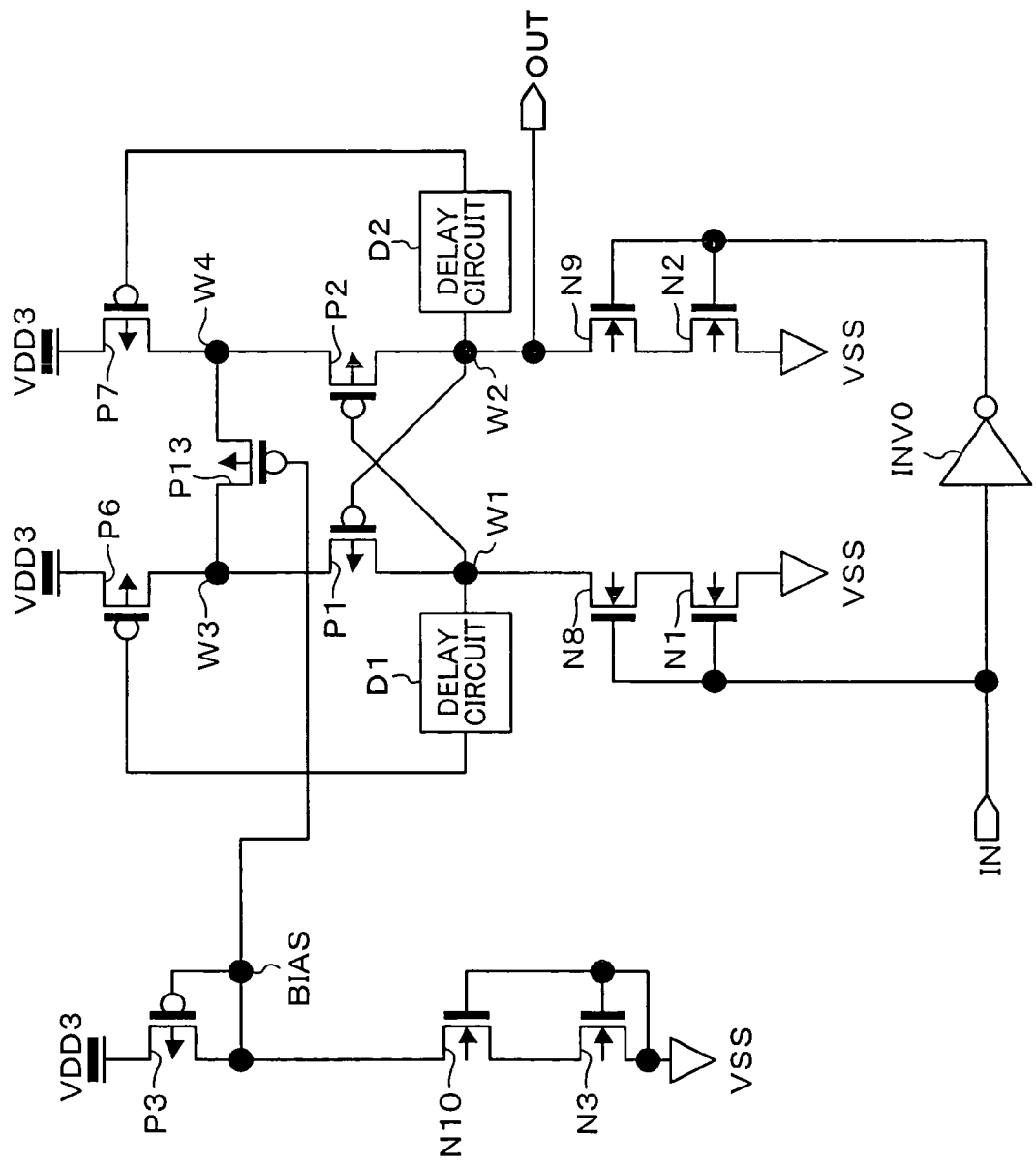
FIG. 23 shows a structure of a first variation of the level shifter of embodiment 11 of the present invention.
Figure 24:
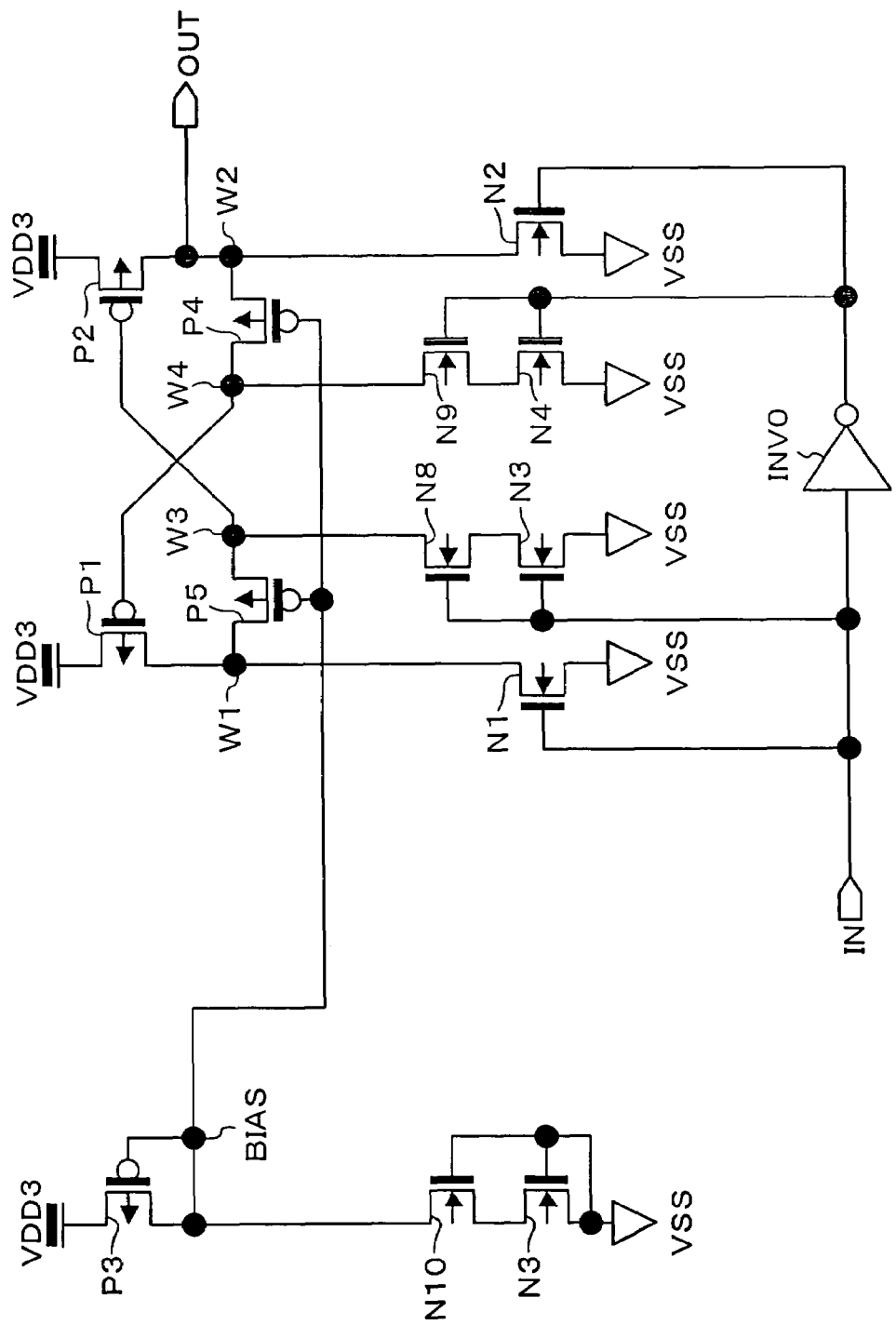
FIG. 24 shows a structure of a second variation of the level shifter of embodiment 11.
Figure 25:
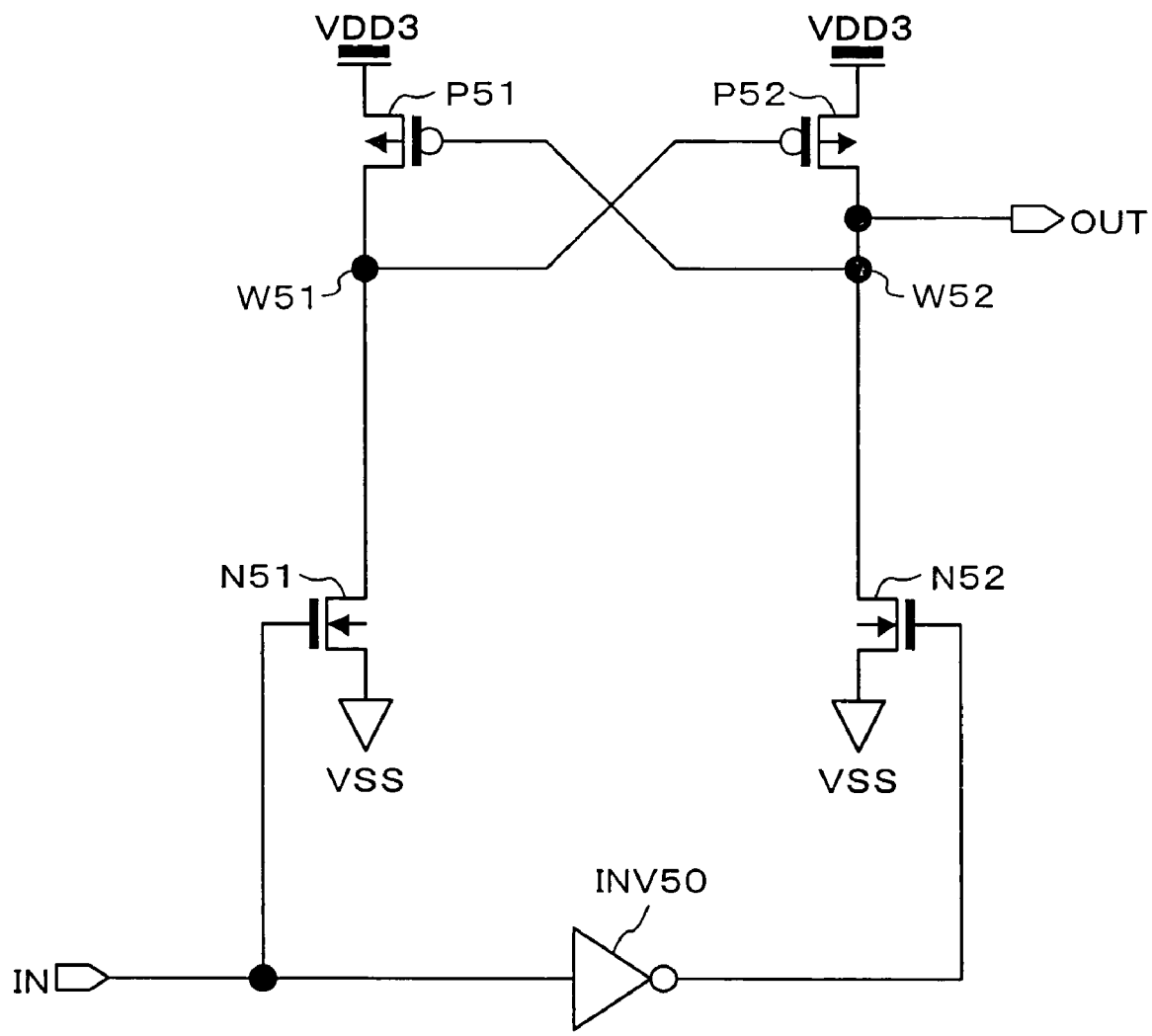
FIG. 25 shows a structure of a conventional level shifter.
Figure 26:
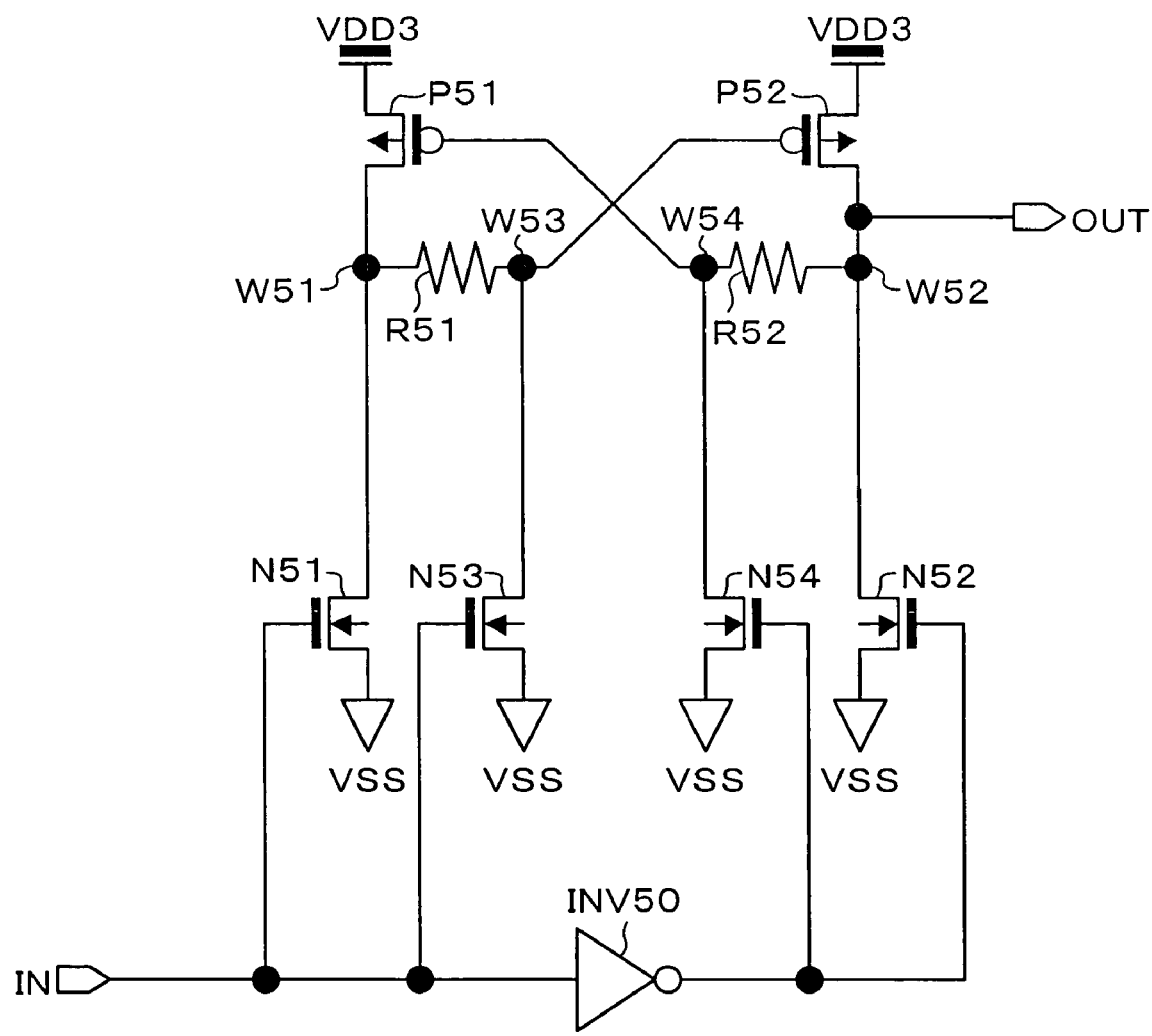
FIG. 26 shows a structure of another conventional level shifter.
Figure 27:
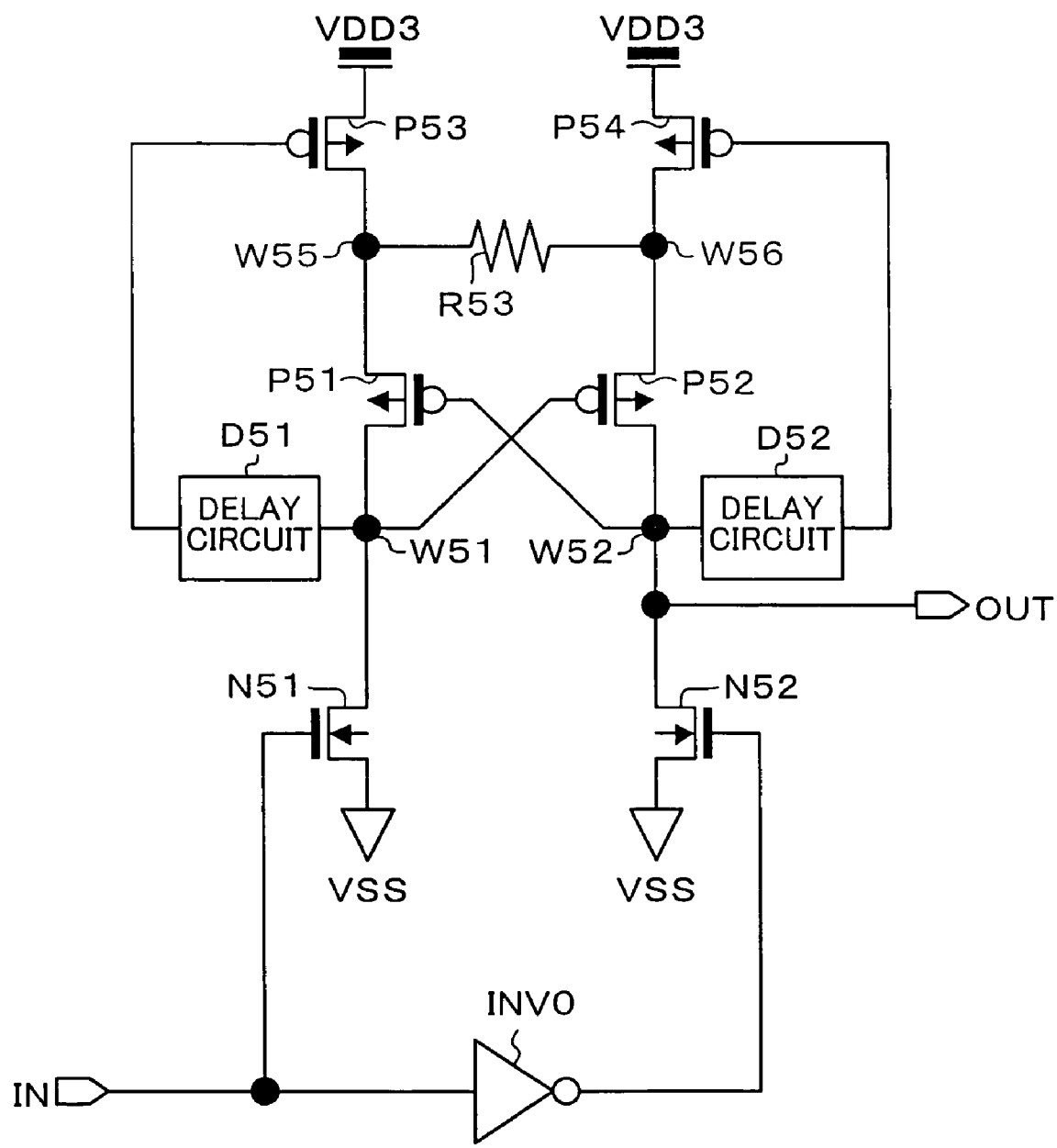
FIG. 27 shows a structure of still another conventional level shifter.
Figure 28:
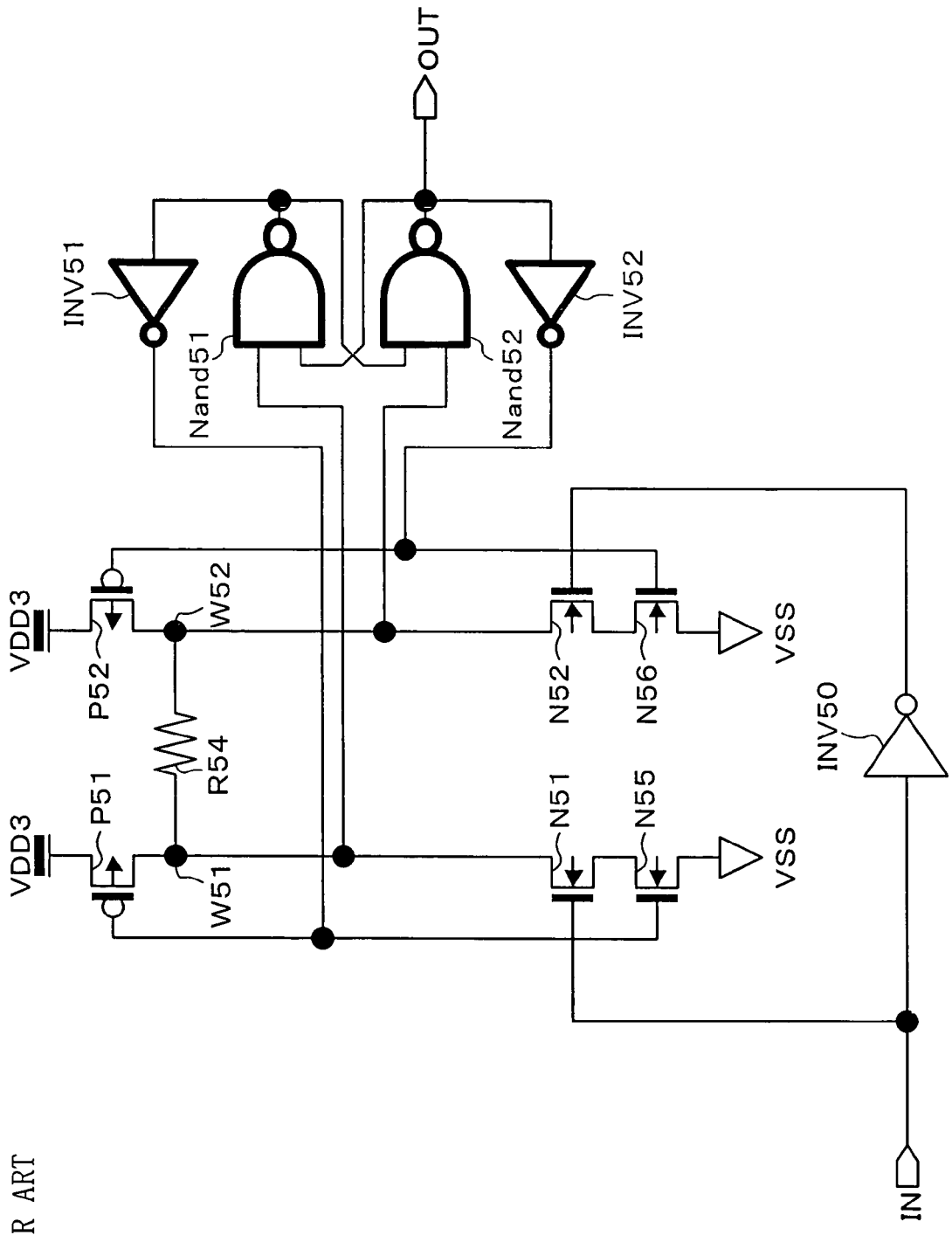
FIG. 28 shows a structure of still another conventional level shifter.

Although the above example of embodiment 11 has been described in connection with the level shifters of FIG. 14 and FIG. 15, the concept of embodiment 11 may be applied to other level shifters. For example, as a matter of course, the concept of embodiment 11 may be applied to the level shifter of FIG. 10, wherein three previously-described high-voltage transistors N8, N9 and N10 are added to the level shifter of FIG. 10, resulting in a level shifter shown in FIG. 23 (first variation).

EMBODIMENT 12

Figure 16:
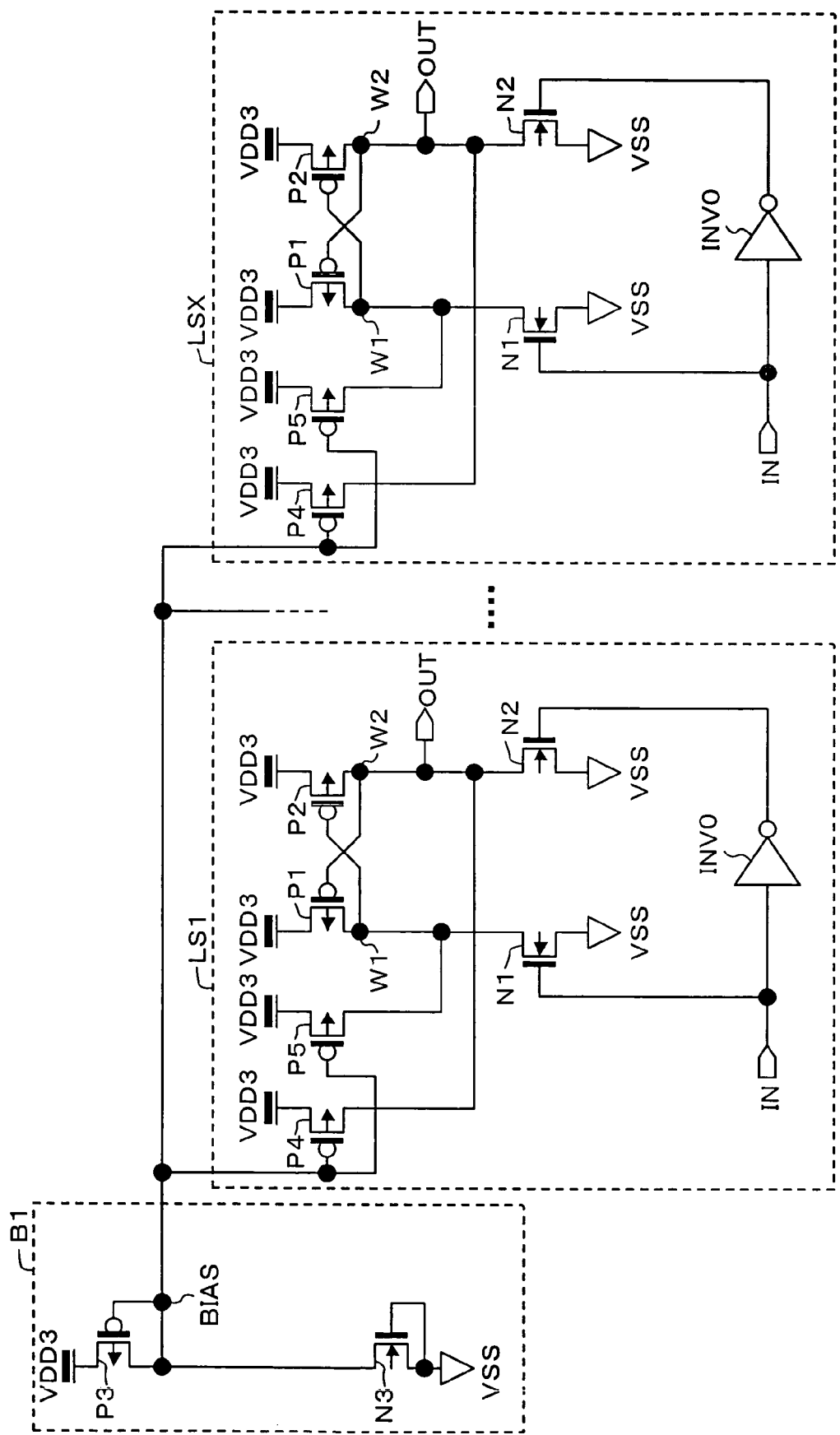
FIG. 16 shows a structure of a level shifter according to embodiment 12 of the present invention.

FIG. 16 shows a specific structure of a level shift device of embodiment 12.

The level shift device of FIG. 16 includes a plurality of level shifters, each of which is the same as the level shifter shown in FIG. 1 of embodiment 1 except that an OFF leakage generation circuit and a circuit for generating a bias potential of a current mirror are shared among the plurality of level shifters. Specifically, one of the plurality of level shifters, a level shifter LS1, includes the components of the level shifter of FIG. 1 other than the P-type transistor P3 and the N-type transistor N3. Another one of the plurality of level shifters, a level shifter LSX, has the same structure as that of the level shifter LS1. Between the level shifter LS1 and the level shifter LSX, a plurality of level shifters having the same structure are provided. The P-type transistor P3 and the N-type transistor N3 are shared among the level shifters LS1 to LSX. The potential of the node BIAS is supplied to each of the level shifters.

With the above structure, the area of the level shift device of FIG. 16 is smaller by the omitted P-type transistors P3 and N-type transistors N3 than an example including the same number of level shifters of FIG. 1. As a result of sharing the P-type transistor P3 and the N-type transistor N3, the OFF leakage current is also shared. Thus, power consumption is further reduced.

In the above examples, the positive voltage level shifters for converting a positive-voltage signal having a low voltage to a positive-voltage signal having a high voltage have been described, but the present invention is not limited thereto. As a matter of course, the present invention is also applicable to a negative voltage level shifter for converting a negative-voltage signal having a low voltage to a negative-voltage signal having a high voltage, which can be constructed by appropriately modifying the positive voltage level shifters, for example, by replacing N-type transistors with P-type transistors and P-type transistors with N-type transistors.

What is claimed is:

1. A level shifter, comprising:
    first and second first-conductivity type transistors for signal input, the first and second first-conductivity type transistors respectively receiving at gates complementary first and second input signals generated using a first voltage supply as a power supply and having ends connected to a ground and the other ends connected to first and second nodes, respectively;
    a power supply circuit having an end connected to a second voltage supply and the other end connected to the first and second nodes, the power supply circuit supplying a voltage of the second voltage supply to one of the first and second nodes while interrupting the supply of the voltage of the second voltage supply to the other node;
    an OFF leakage generation circuit formed by a third first-conductivity type transistor which has an end and gate connected to the ground and the other end connected to a third node; and
    a current conversion circuit connected to the third node to convert a current flowing through the third first-conductivity type transistor to a current flowing from the second voltage supply and amplify the converted current by a predetermined factor, the amplified current being output to the first and second nodes.

2. The level shifter of claim 1, wherein the current conversion circuit is a current mirror formed by a second-conductivity type transistor.

3. The level shifter of claim 1, further comprising a switch circuit between the output of the current conversion circuit and the first and second nodes, the switch circuit being controlled based on the potentials of the first and second nodes to supply the output current of the current conversion circuit to any one of the first and second nodes.

4. The level shifter of claim 3, wherein:
    when one of the first and second nodes is equal in potential to the second voltage supply, the switch circuit disconnects the output of the current conversion circuit from the other node; and
    when the one of the first and second nodes is equal in potential to the ground, the switch circuit connects the output of the current conversion circuit to the other node.

5. The level shifter of claim 1, wherein:
    the output of the current conversion circuit is provided between the second voltage supply and the power supply circuit; and
    the switch circuit is realized by the power supply circuit.

* * * * *